United States Patent
Lee et al.

(10) Patent No.: US 10,109,511 B2
(45) Date of Patent: Oct. 23, 2018

(54) POST-PROCESSING APPARATUS OF SOLAR CELL

(71) Applicant: LG ELECTRONICS INC., Seoul (KR)

(72) Inventors: Kyoungsoo Lee, Seoul (KR); Minho Choi, Seoul (KR); Jinhyung Lee, Seoul (KR); Gyeayoung Kwag, Seoul (KR); Sangwook Park, Seoul (KR)

(73) Assignee: LG ELECTRONICS INC., Seoul (KR)

(*) Notice: Subject to any disclaimer, the term of this patent is extended or adjusted under 35 U.S.C. 154(b) by 474 days.

(21) Appl. No.: 14/741,286

(22) Filed: Jun. 16, 2015

(65) Prior Publication Data

US 2015/0364351 A1 Dec. 17, 2015

(30) Foreign Application Priority Data

Jun. 17, 2014 (KR) ........................ 10-2014-0073575

(51) Int. Cl.
*F27B 9/06* (2006.01)
*H01L 21/67* (2006.01)
(Continued)

(52) U.S. Cl.
CPC .... *H01L 21/67115* (2013.01); *H01L 21/6776* (2013.01); *H01L 31/1864* (2013.01);
(Continued)

(58) Field of Classification Search
CPC . H01L 31/028; H01L 31/0288; H01L 31/182; H01L 31/186; H01L 31/1804; H01L 31/1864; H01L 31/1868; H01L 31/1876; H01L 21/26; H01L 21/268; H01L 21/2686; H01L 21/28176; H01L 21/28185; H01L 21/324; H01L 21/67115; H01L 21/67173; H01L 21/677; H01L 21/67748; H01L 21/6776; H01L 21/68742;
(Continued)

(56) References Cited

U.S. PATENT DOCUMENTS 4,504,323 A 3/1985 Arai et al.
6,467,491 B1 10/2002 Sugiura et al.
(Continued)

FOREIGN PATENT DOCUMENTS

CN 101053061 A 10/2007
CN 202808935 U 3/2013
(Continued)

*Primary Examiner* — Hung D Nguyen
(74) *Attorney, Agent, or Firm* — Birch, Stewart, Kolasch & Birch, LLP

(57) ABSTRACT

A post-processing apparatus of a solar cell carries out a post-processing operation including a main period for heat-treating a solar cell including a semiconductor substrate while providing light to the solar cell. The post-processing apparatus includes a main section to carry out the main period. The main section includes a first heat source unit to provide heat to the semiconductor substrate and a light source unit to provide light to the semiconductor substrate. The first heat source unit and the light source unit are positioned in the main section. The light source unit includes a light source constituted by a plasma lighting system (PLS).

4 Claims, 19 Drawing Sheets

(51) Int. Cl.
*H05B 3/00* (2006.01)
*H01L 21/677* (2006.01)
*H01L 31/18* (2006.01)

(52) U.S. Cl.
CPC ............ *H05B 3/0047* (2013.01); *Y02E 10/50* (2013.01); *Y02P 70/521* (2015.11)

(58) Field of Classification Search
CPC . H01L 21/68785; H05B 3/0047; Y02E 10/50; Y02E 10/52; Y02P 70/521
USPC ........ 219/385, 388, 390, 409; 392/416, 418, 392/423
See application file for complete search history.

(56) References Cited

U.S. PATENT DOCUMENTS

| | | |
|---|---|---|
| 2002/0067918 A1 | 6/2002 | Camm et al. |
| 2006/0021975 A1 | 2/2006 | Ott et al. |
| 2006/0065849 A1 | 3/2006 | Hwang et al. |
| 2007/0069659 A1 | 3/2007 | Park |
| 2010/0007285 A1 | 1/2010 | Schroder et al. |
| 2010/0040991 A1 | 2/2010 | Chung et al. |
| 2011/0248026 A1 | 10/2011 | Schroder et al. |
| 2012/0067864 A1 | 3/2012 | Kusuda et al. |
| 2013/0257270 A1 | 10/2013 | Rojeski |
| 2014/0213016 A1* | 7/2014 | Sheng ............... H01L 31/02167 438/97 |

FOREIGN PATENT DOCUMENTS

| | | |
|---|---|---|
| DE | 102006047472 A1 | 4/2008 |
| JP | 2013-530514 A | 7/2013 |
| KR | 10-2004-0061397 A | 7/2004 |
| KR | 10-2011-0084788 A | 7/2011 |
| KR | 10-2012-0022197 A | 3/2012 |
| KR | 10-1129038 B1 | 3/2012 |
| KR | 10-1335161 B1 | 11/2013 |
| WO | WO 2006/128247 A1 | 12/2006 |
| WO | WO 2013/173867 A1 | 11/2013 |

* cited by examiner (a)

(b)

POST-PROCESSING APPARATUS OF SOLAR CELL

CROSS-REFERENCE TO RELATED APPLICATION

This application claims the priority benefit of Korean Patent Application No. 10-2014-0073575, filed on Jun. 17, 2014 in the Korean Intellectual Property Office, the disclosure of which is incorporated herein by reference.

BACKGROUND OF THE INVENTION

1. Field of the Invention

Embodiments of the present invention relate to a post-processing apparatus of a solar cell, and more particularly to a post-processing apparatus of a solar cell based on a crystalline semiconductor substrate.

2. Description of the Related Art

In recent years, exhaustion of existing energy resources, such as petroleum and coal, has been forecast with the result that interest in alternative energy resources substituting for the existing energy resources has risen. Among such alternative energy resources is a solar cell that converts photovoltaic energy into electrical energy using a semiconductor device, which is in the spotlight as a next-generation cell.

The solar cell may be fabricated through formation of various layers and electrodes based on design. The design of various layers and electrodes may determine the efficiency of the solar cell. Low efficiency of the solar cell must be overcome in order to commercialize the solar cell. For this reason, various layers and electrodes of the solar cell are designed such that the efficiency of the solar cell can be maximized, and various processing procedures are carried out to maximize the efficiency of the solar cell. Consequently, it is necessary to provide a post-processing apparatus of a solar cell that is capable of maximizing the efficiency of the solar cell.

SUMMARY OF THE INVENTION

Therefore, the embodiments of the present invention have been made in view of the above problems, and it is an object of the embodiments of the present invention to provide a post-processing apparatus of a solar cell that is capable of reducing an output loss of the solar cell.

In accordance with an aspect of the present invention, the above and other objects can be accomplished by the provision of a post-processing apparatus that carries out a post-processing operation including a main period for heat-treating a solar cell including a semiconductor substrate while providing light to the solar cell, the post-processing apparatus including a main section to carry out the main period, wherein the main section includes a first heat source unit to provide heat to the semiconductor substrate and a light source unit to provide light to the semiconductor substrate, the first heat source unit and the light source unit being positioned in the main section, and the light source unit includes a light source constituted by a plasma lighting system (PLS).

BRIEF DESCRIPTION OF THE DRAWINGS

The above and other objects, features and other advantages of the embodiments of the present invention will be more clearly understood from the following detailed description taken in conjunction with the accompanying drawings, in which.

DETAILED DESCRIPTION OF THE EMBODIMENTS

Figure 1:
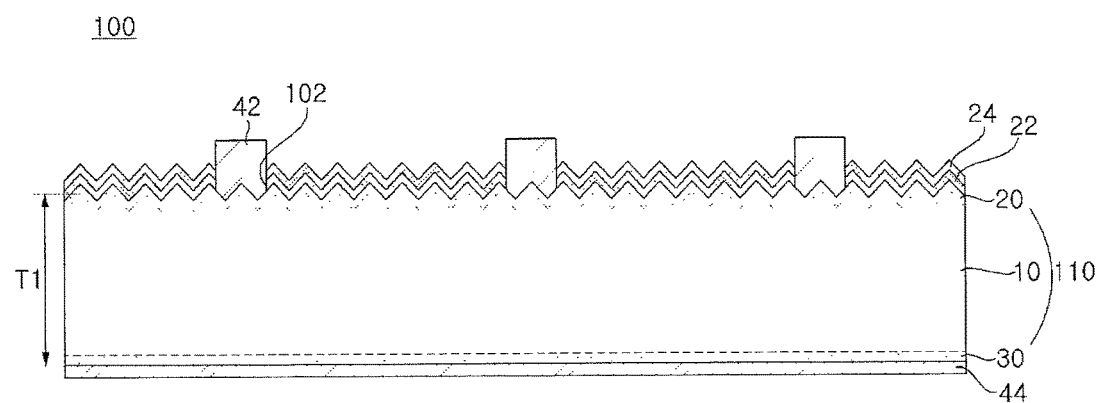
FIG. 1 is a sectional view showing an example of a solar cell manufactured using a manufacturing method of a solar cell according to an embodiment of the present invention.

Reference will now be made in detail to the embodiments of the present invention, examples of which are illustrated in the accompanying drawings. However, it will be understood that the present invention should not be limited to the embodiments and may be modified in various ways.

In the drawings, to clearly and briefly explain the embodiments of the present invention, illustration of elements having no connection with the description is omitted, and the same or similar elements are designated by the same reference numerals throughout the specification. In addition, in the drawings, for more clear explanation, the dimensions of elements, such as thickness, width, and the like, are exaggerated or reduced, and thus the thickness, width, and the like of the embodiments of the present invention are not limited to the illustration of the drawings.

In the entire specification, when an element is referred to as "including" another element, the element should not be understood as excluding other elements so long as there is no special conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a post-processing apparatus of a solar cell according to an embodiment of the present invention will be described in detail with reference to the accompanying drawings. An example of a solar cell manufactured using a manufacturing method of a solar cell including a post-processing operation carried out by the post-processing apparatus of the solar cell according to the embodiment of the present invention will be described first, the manufacturing method of the solar cell including the post-processing operation will be described, and then the post-processing apparatus of the solar cell will be described.

Figure 2:
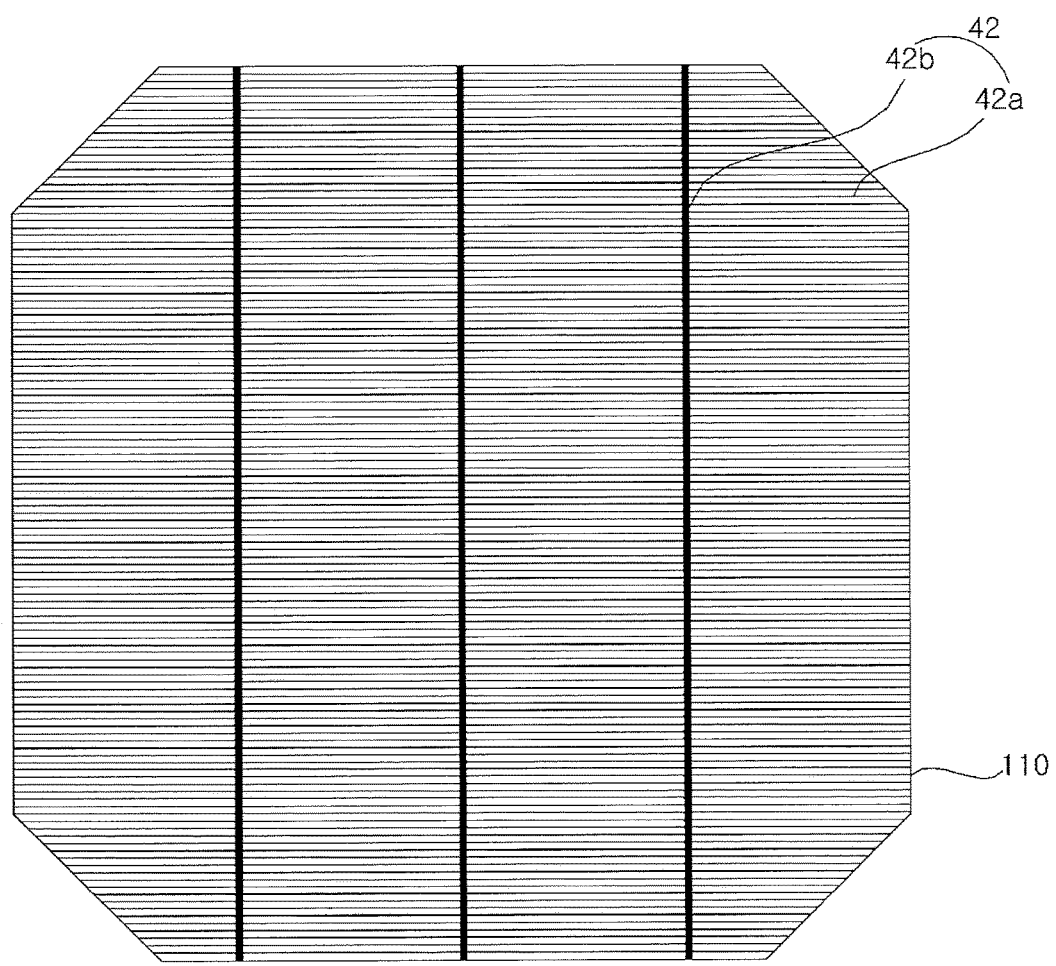
FIG. 2 is a plan view showing the front of the solar cell shown in FIG. 1 according to an embodiment of the present invention.

FIG. 1 is a sectional view showing an example of a solar cell manufactured using a manufacturing method of a solar cell according to an embodiment of the present invention, and FIG. 2 is a plan view showing the front of the solar cell shown in FIG. 1. A semiconductor substrate and an electrode are mainly shown in FIG. 2.

Referring to FIG. 1, a solar cell 100 according to this embodiment includes a semiconductor substrate 110 including a base region 10, a first conductive region 20 of a first conductive type, a second conductive region 30 of a second conductive type, a first electrode 42 connected to the first conductive region 20, and a second electrode 44 connected to the second conductive region 30. The solar cell 100 may further include dielectric films, such as a first passivation film 22 and an anti-reflection film 24. Hereinafter, the solar cell 100 will be described in more detail.

The semiconductor substrate 110 may be formed of a crystalline semiconductor. For example, the semiconductor substrate 110 may be formed of a single crystalline semiconductor (e.g. single crystalline silicon) or a polycrystalline semiconductor (e.g. polycrystalline silicon). In particular, the semiconductor substrate 110 may be formed of a single crystalline semiconductor (e.g. a single crystalline semiconductor wafer, more specifically a single crystalline silicon wafer). In an instance in which the semiconductor substrate 110 is formed of a single crystalline semiconductor (e.g. single crystalline silicon) as described above, the solar cell 100 may be a single crystalline semiconductor solar cell (e.g. a single crystalline silicon solar cell). Since the solar cell 100 is based on the semiconductor substrate 110 formed of a crystalline semiconductor exhibiting high crystallinity and thus low defectiveness as described above, the solar cell 100 may exhibit excellent electrical characteristics.

The front surface and/or the back surface of the semiconductor substrate 110 may be textured such that the front surface and/or the back surface of the semiconductor substrate 110 have a rugged shape. For example, the rugged shape may be a pyramidal shape, formed at a (111) surface of the semiconductor substrate 110, having an irregular size. In an instance in which the rugged shape is formed at the front surface of the semiconductor substrate 110 by texturing as described above, the surface roughness of the semiconductor substrate 110 may be increased with the result that the reflectance of light incident upon the front surface of the semiconductor substrate 110 may be decreased. Consequently, the quantity of light reaching a pn junction formed by the base region 10 and the first conductive region 20 may be increased with the result that light loss of the solar cell 100 may be minimized. In this embodiment of the present invention, the rugged shape is formed at the front surface of the semiconductor substrate 110 to decrease the reflectance of incident light, whereas the rugged shape is not formed at the back surface of the semiconductor substrate 110 to increase the reflectance of incident light. However, the embodiments of the present invention are not limited thereto. For example, the rugged shape may be formed at both the front surface and the back surface of the semiconductor substrate 110, or the rugged shape may not be formed at either the front surface or the back surface of the semiconductor substrate 110.

The base region 10 of the semiconductor substrate 110 may be a second conductive base region 10 having a relatively low doping concentration of a second conductive dopant. For example, the base region 10 may be more distant from the front surface of the semiconductor substrate 110 and more adjacent to the back surface of the semiconductor substrate 110 than the first conductive region 20. In addition, the base region 10 may be more adjacent to the front surface of the semiconductor substrate 110 and more distant from the back surface of the semiconductor substrate 110 than the second conductive region 30. However, the embodiments of the present invention are not limited thereto. The base region 10 may be differently positioned.

The base region 10 may be formed of a crystalline semiconductor having a second conductive dopant. For example, the base region 10 may be formed of a single crystalline semiconductor (e.g. single crystalline silicon) or a polycrystalline semiconductor (e.g. polycrystalline silicon) having a second conductive dopant. In particular, the base region 10 may be formed of a single crystalline semiconductor (e.g. a single crystalline semiconductor wafer, more specifically a single crystalline silicon wafer) having a second conductive dopant.

The second conductive type may be an n-type or a p-type. In an instance in which the base region 10 is of an n-type, the base region 10 may be formed of a single crystalline semiconductor or a polycrystalline semiconductor doped with a group-V element, such as phosphorus (P), arsenic (As), bismuth (Bi), or antimony (Sb). On the other hand, in an instance in which the base region 10 is of a p-type, the base region 10 may be formed of a single crystalline semiconductor or a polycrystalline semiconductor doped with a group-III element, such as boron (B), aluminum (Al), gallium (Ga), or Indium (In). However, the embodiments of the present invention are not limited thereto. The base region 10 and the second conductive dopant may be formed of various materials.

For example, the base region 10 may be of a p-type. In this case, materials included in the second electrode 44 may be diffused in to the semiconductor substrate 110 to form the second conductive region 30 at an operation of firing the second electrode 44. As a result, an additional doping process for forming the second conductive region 30 may be omitted, thereby simplifying a manufacturing process of the solar cell 100. However, the embodiments of the present invention are not limited thereto. For example, the base region 10 and the second conductive region 30 may be of a p-type, and the first conductive region 20 may be of an n-type.

The first conductive region 20 of the first conductive type, which is opposite to the second conductive type of the base region 10, may be formed at the front surface of the semiconductor substrate 110. The first conductive region 20 may form a pn junction together with the base region 10 to constitute an emitter region for generating carriers through photoelectric conversion.

In this embodiment of the present invention, the first conductive region 20 may be a doped region constituting a portion of the semiconductor substrate 110. In this case, the first conductive region 20 may be formed of a crystalline semiconductor having a first conductive dopant. For example, the first conductive region 20 may be formed of a single crystalline semiconductor (e.g. single crystalline silicon) or a polycrystalline semiconductor (e.g. polycrystalline silicon) having a first conductive dopant. In particular, the first conductive region 20 may be formed of a single crystalline semiconductor (e.g. a single crystalline semiconductor wafer, more specifically a single crystalline silicon wafer) having a first conductive dopant. In an instance in which the first conductive region 20 constitutes a portion of the semiconductor substrate 110 as described above, junction characteristics between the first conductive region 20 and the base region 10 may be improved.

However, the embodiments of the present invention are not limited thereto. For example, the first conductive region 20 may be formed on the semiconductor substrate 110 separately from the semiconductor substrate 110, which will hereinafter be described in more detail with reference to FIG. 9.

The first conductive type may be a p-type or an n-type. In an instance in which the first conductive region 20 is of a p-type, the first conductive region 20 may be formed of a single crystalline semiconductor or a polycrystalline semiconductor doped with a group-III element, such as boron (B), aluminum (Al), gallium (Ga), or Indium (In). On the other hand, in an instance in which the first conductive region 20 is of an n-type, the first conductive region 20 may be formed of a single crystalline semiconductor or a polycrystalline semiconductor doped with a group-V element, such as phosphorus (P), arsenic (As), bismuth (Bi), or antimony (Sb). However, the embodiments of the present invention are not limited thereto. Various materials may be used as the first conductive dopant.

In the figure, the first conductive region 20 is shown as having a homogeneous structure of a generally uniform doping concentration. However, the embodiments of the present invention are not limited thereto. In another embodiment of the present invention, the first conductive region 20 may have a selective structure, which will hereinafter be described in detail with reference to FIG. 8.

The second conductive region 30 of the second conductive type, which is the same as the second conductive type of the base region 10, having a higher doping concentration of a second conductive dopant than the base region 10, may be formed at the back surface of the semiconductor substrate 110. The second conductive region 30 may form a back surface field to constitute a back surface field region for preventing or reducing loss of the carriers due to recombination at the surface of the semiconductor substrate 110 (more exactly, the back surface of the semiconductor substrate 110).

In this embodiment of the present invention, the second conductive region 30 may be a doped region constituting a portion of the semiconductor substrate 110. In this case, the second conductive region 30 may be formed of a crystalline semiconductor having a second conductive dopant. For example, the second conductive region 30 may be formed of a single crystalline semiconductor (e.g. single crystalline silicon) or a polycrystalline semiconductor (e.g. polycrystalline silicon) having a second conductive dopant. In particular, the second conductive region 30 may be formed of a single crystalline semiconductor (e.g. a single crystalline semiconductor wafer, more specifically a single crystalline silicon wafer) having a second conductive dopant. In an instance in which the second conductive region 30 constitutes a portion of the semiconductor substrate 110 as described above, junction characteristics between the second conductive region 30 and the base region 10 may be improved.

However, the embodiments of the present invention are not limited thereto. For example, the second conductive region 30 may be formed on the semiconductor substrate 110 separately from the semiconductor substrate 110, which will hereinafter be described in more detail with reference to FIG. 9.

The second conductive type may be an n-type or a p-type. In an instance in which the second conductive region 30 is of an n-type, the second conductive region 30 may be formed of a single crystalline semiconductor or a polycrystalline semiconductor doped with a group-V element, such as phosphorus (P), arsenic (As), bismuth (Bi), or antimony (Sb). On the other hand, in an instance in which the second conductive region 30 is of a p-type, the second conductive region 30 may be formed of a single crystalline semiconductor or a polycrystalline semiconductor doped with a group-III element, such as boron (B), aluminum (Al), gallium (Ga), or Indium (In). However, the embodiments of the present invention are not limited thereto. Various materials may be used as the second conductive dopant. The second conductive dopant of the second conductive region 30 may be formed of a material identical to that of the second conductive dopant of the base region 10 or a material different from that of the second conductive dopant of the base region 10.

In this embodiment of the present invention, the second conductive region 30 is shown as having a homogeneous structure of a generally uniform doping concentration. However, the embodiments of the present invention are not limited thereto. In another embodiment of the present invention, the second conductive region 30 may have a selective structure or a local structure, which will hereinafter be described in detail with reference to FIG. 8.

In this embodiment of the present invention, the first and second conductive regions 20 and 30 formed at the semiconductor substrate 110 are doped with the first and second conductive dopants, and the base region 10 is doped with the second conductive dopant. As a result, the dopants are distributed throughout the semiconductor substrate 110. At this time, any specific dopant may be combined with a different material or element in the semiconductor substrate 110 to lower the characteristics of the solar cell 100. For example, in an instance in which the semiconductor substrate 110 has boron (B) as a dopant, boron (B) may react with oxygen (O) to form a B—O combination. Such a B—O combination may greatly reduce lifetime of the carriers, thereby lowering the characteristics of the solar cell 100. Particularly, in an instance in which boron (B) is used as the second conductive agent included in the base region 10, and therefore the base region 10 is of a p-type, a large amount of the B—O combination may be distributed over the large area of the semiconductor substrate 110, thereby greatly lowering the characteristics of the solar cell 100.

In this embodiment of the present invention, therefore, a post-processing operation (ST50) (see FIG. 3) may be carried out such that any combination (e.g. the above-mentioned B—O combination) which may lower the characteristics of the solar cell 100 is not generated to prevent or reduce lowering or deterioration of the characteristics of the solar cell 100, which will hereinafter be described in more detail when describing a method of manufacturing the solar cell 100.

The semiconductor substrate 110 may have a thickness T1 of 200 µm or less. If the thickness T1 of the semiconductor substrate 110 is greater than 200 µm, it may be difficult for effects obtained by carrying out the post-processing operation (ST50) to be exhibited throughout the semiconductor substrate 110. For example, the semiconductor substrate 110 may have a thickness T1 of 100 µm to 200 µm. If the thickness T1 of the semiconductor substrate 110 is less than 100 µm, the efficiency of the solar cell 100 may be decreased and the mechanical characteristics of the solar cell 100 may not be sufficient since the thickness T1 of the semiconductor substrate 110 is insufficient to perform photoelectric conversion. However, the embodiments of the present invention are not limited thereto. The thickness T1 of the semiconductor substrate 110 may be variously changed.

The first passivation film 22 and the anti-reflection film 24 are sequentially formed on the front surface of the semiconductor substrate 110, more exactly on the first conductive region 20 formed on the semiconductor substrate 110, and the first electrode 42 is formed at the first conductive region 20 in contact through the first passivation film 22 and the anti-reflection film 24 (i.e. via an opening 102 formed through the first passivation film 22 and the anti-reflection film 24).

The first passivation film 22 and the anti-reflection film 24 may be substantially formed throughout the front surface of the semiconductor substrate 110 excluding the opening 102 corresponding to the first electrode 42.

The first passivation film 22 is formed at the first conductive region 20 in contact to passivate defects existing on the surface of the first conductive region 20 or in a bulk of the first conductive region 20. The passivation of defects may remove a recombination site of minority carriers, which may increase an open-circuit voltage Voc of the solar cell 100. The anti-reflection film 24 reduces the reflectance of light incident upon the front surface of the semiconductor substrate 110. Through reduction in the reflectance of light incident upon the front surface of the semiconductor substrate 110, the quantity of light reaching the pn junction formed by the base region 10 and the first conductive region 20 may be increased with the result that a short-circuit current Isc of the solar cell 100 may be increased. As described above, the first passivation film 22 and the anti-reflection film 24 may increase the open-circuit voltage and the short-circuit current of the solar cell 100, thereby improving the efficiency of the solar cell 100.

The first passivation film 22 may be formed of various materials. For example, the first passivation film may be formed of a dielectric material including hydrogen. In an instance in which the first passivation film 22 includes hydrogen as described above, the first passivation film 22 may function to passivate the surface of the semiconductor substrate 110 and, in addition, function as a hydrogen source for supplying hydrogen to the surface of the semiconductor substrate 110 or into a bulk of the semiconductor substrate 110 at the post-processing operation (ST50).

For example, the first passivation film 22 may include $10^{20}$ to $10^{22}$ ea/cm$^3$ of hydrogen. The hydrogen content of the first passivation film 22 is limited to a range in which the first passivation film 22 can effectively function as the hydrogen source when the first passivation film 22 passivates the surface of the semiconductor substrate 110 and at the post-processing operation (ST50). However, the embodiments of the present invention are not limited thereto. The hydrogen content of the first passivation film 22 may be variously changed.

For example, the first passivation film 22 may include a silicon nitride (SiNx:H) including hydrogen, a silicon oxide nitride (SiOxNy:H) including hydrogen, a silicon carbide (SiCx:H) including hydrogen, or a silicon oxide (SiOx:H) including hydrogen. However, the embodiments of the present invention are not limited thereto. The first passivation film 22 may include various other materials.

The first passivation film 22 may have a thickness of 50 nm to 200 nm. If the thickness of the first passivation film 22 is less than 50 nm, the passivation effect may not be sufficient, and the hydrogen diffusion effect at the post-processing operation (ST50) may not be sufficient. On the other hand, if the thickness of the first passivation film 22 is greater than 200 nm, the process time may be increased while the effects are not greatly improved, and the thickness of the solar cell 100 may be increased. However, the embodiments of the present invention are not limited thereto. The thickness of the first passivation film 22 may be variously changed.

The anti-reflection film 24 may be formed of various materials. For example, the anti-reflection film 24 may have a single film structure or a multi-layer film structure formed of at least one selected from a group consisting of a silicon nitride, a silicon nitride including hydrogen, a silicon oxide, a silicon oxide nitride, an aluminum oxide, MgF$_2$, ZnS, TiO$_2$, and CeO$_2$. For example, the anti-reflection film 24 may include a silicon nitride.

In this embodiment of the present invention, the anti-reflection film 24 formed at the semiconductor substrate 110 in contact includes hydrogen such that the anti-reflection film 24 can effectively function to passivate the surface of the semiconductor substrate 110 and function as the hydrogen source. However, the embodiments of the present invention are not limited thereto. For example, only the anti-reflection film 24 may include hydrogen, or both the anti-reflection film 24 and the first passivation film 22 may include hydrogen. In an instance in which the anti-reflection film 24 includes hydrogen, the material, hydrogen content, thickness, etc. of the anti-reflection film 24 may be equal to or similar to those of the first passivation film 22.

Furthermore, in this embodiment of the present invention, the first passivation film 22, which is a dielectric film disposed at the front surface of the semiconductor substrate 110, includes hydrogen such that the first passivation film 22 can supply the hydrogen at the post-processing operation (ST50). This is because a short-wavelength light is easily incident upon the front surface of the semiconductor substrate 110 with the result that undesired combination (e.g. the above-mentioned B—O combination) may be highly generated, whereas generation of undesired combination is advantageously prevented or reduced when hydrogen is supplied to the front surface of the semiconductor substrate 110. However, the embodiments of the present invention are not limited thereto. For example, a dielectric film formed on the front surface and/or the back surface of the semiconductor substrate 110 may include hydrogen such that the dielectric film can supply the hydrogen at the post-processing operation (ST50).

In addition, in the above-described embodiment of the present invention, both the first passivation film 22 and the anti-reflection film 24 are included. However, the embodiments of the present invention are not limited thereto. For example, any one selected from between the first passivation film 22 and the anti-reflection film 24 may perform both a reflection preventing function and a passivation function in a state in which the other selected from between the first passivation film 22 and the anti-reflection film 24 is not provided. In another example, various films may be formed on the front surface of the semiconductor substrate 110 in addition to the first passivation film 22 and the anti-reflection film 24. Various other modifications are also possible.

The first electrode 42 is electrically connected to the first conductive region 20 through the first passivation film 22 and the anti-reflection film 24 (i.e. via the opening 102 formed through the first passivation film 22 and the anti-reflection film 24). The first electrode 42 may be formed of various materials such that the first electrode 42 can have various shapes. The shape of the first electrode 42 will hereinafter be described with reference to FIG. 2.

The second electrode 44 is formed on the back surface of the semiconductor substrate 110, more exactly on the second conductive region 30 formed on the semiconductor substrate 110. In this embodiment of the present invention, the second electrode 44 is formed throughout the back surface of the semiconductor substrate 110 such that light can be reflected by the back surface of the semiconductor substrate 110. In this case, light reaching the back surface of the semiconductor substrate 110 is reflected to the interior of the semiconductor substrate 110, thereby improving the efficiency in use of the light. At this time, the second electrode 44 may be formed at the back surface of the semiconductor substrate 110 or the second conductive region 30 in contact.

In this embodiment of the present invention, materials included in the second electrode 44 may be diffused into the semiconductor substrate 110 to form the second conductive region 30 at the operation of firing the second electrode 44. As a result, an additional doping process for forming the second conductive region 30 may be omitted, thereby simplifying the manufacturing process of the solar cell 100. In addition, damage to the semiconductor substrate 110 or defects of the semiconductor substrate 110, which may occur at a process of forming the second conductive region 30 through doping, may be prevented or reduced.

Hereinafter, the planar shape of the first electrode 42 will be described in detail with reference to FIG. 2.

Referring to FIG. 2, the first electrode 42 may include a plurality of finger electrodes 42a arranged at a uniform pitch such that the finger electrodes 42a are spaced apart from each other. In the figure, the finger electrodes 42a are illustrated as being parallel to each other and, in addition, parallel to the edge of the semiconductor substrate 110. However, the embodiments of the present invention are not limited thereto. The first electrode 42 may further include at least one bus bar electrode 42b formed in a direction intersecting the finger electrodes 42a for interconnecting the finger electrodes 42a. Only one bus bar electrode 42b may be provided, or a plurality of bus bar electrodes 42b arranged at a larger pitch than the finger electrodes 42a may be provided as shown in FIG. 2. In this case, the width of each of the bus bar electrodes 42b may be greater than that of each of the finger electrodes 42a. However, the embodiments of the present invention are not limited thereto. For example, the width of each of the bus bar electrodes 42b may be equal to or less than that of each of the finger electrodes 42a.

When viewed in section, the finger electrodes 42a and the bus bar electrodes 42b of the first electrode 42 may be formed through the first passivation film 22 and the anti-reflection film 24. That is, the opening 102 may be formed through the first passivation film 22 and the anti-reflection film 24 such that the opening 102 corresponds to the finger electrodes 42a and the bus bar electrodes 42b. In another example, the finger electrodes 42a of the first electrode 42 may be formed through the first passivation film 22 and the anti-reflection film 24, and the bus bar electrodes 42b of the first electrode 42 may be formed on the first passivation film 22 and the anti-reflection film 24. In this case, the opening 102 may be formed through the first passivation film 22 and the anti-reflection film 24 such that the opening 102 corresponds to the finger electrodes 42a but not the bus bar electrodes 42b.

The solar cell 100 may be processed so as to prevent or reduce generation of any combination which may lower the characteristics of the solar cell 100 at the post-processing operation (ST50) as previously described, which will hereinafter be described in more detail when describing a manufacturing method of the solar cell 100.

Figure 3:
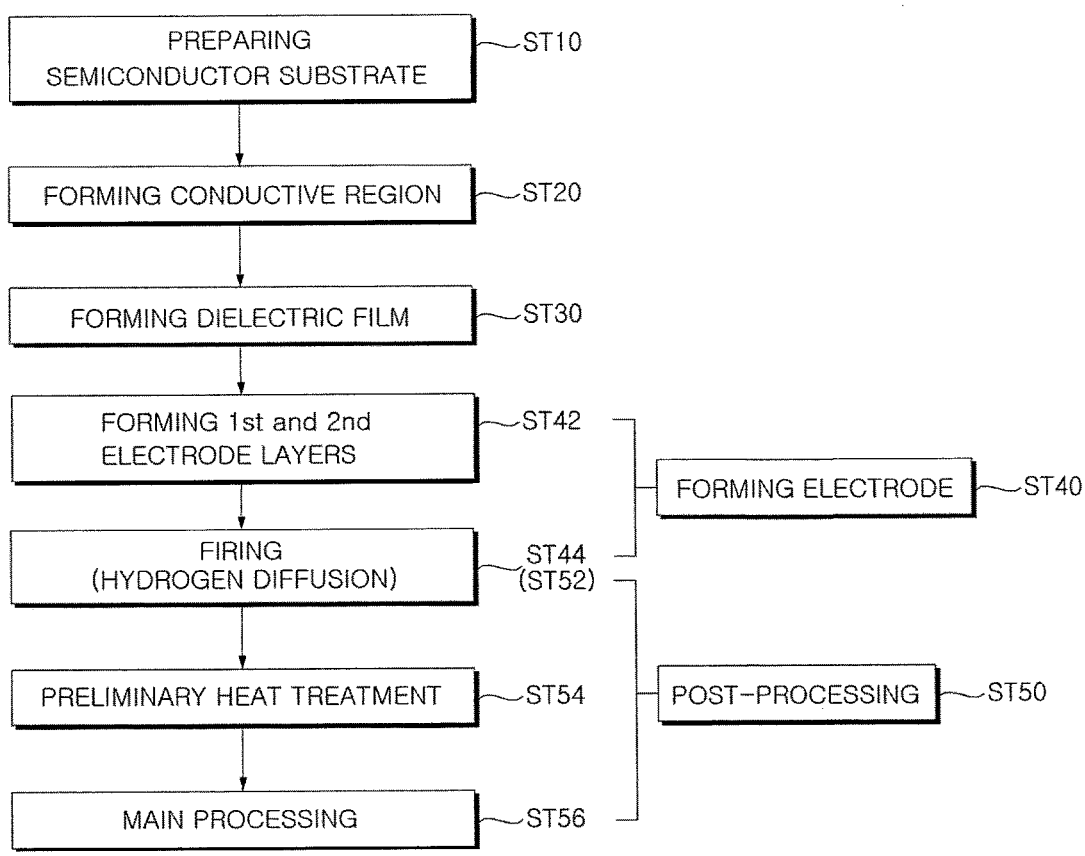
FIG. 3 is a flowchart showing a manufacturing method of a solar cell according to an embodiment of the present invention.

FIG. 3 is a flowchart showing a manufacturing method of a solar cell according to an embodiment of the present invention, and FIGS. 4A to 4G are sectional views showing the manufacturing method of the solar cell shown in FIG. 3. A detailed description will not be given of parts of the solar cell shown in FIGS. 3 and 4A to 4G identical to or similar to those of the solar cell 100 described with reference to FIGS. 1 and 2. Hereinafter, only parts of the solar cell shown in FIGS. 3 and 4A to 4G different from those of the solar cell 100 described with reference to FIGS. 1 and 2 will be described in more detail.

Referring to FIG. 3, the manufacturing method of the solar cell 100 according to the embodiment of the present invention includes a semiconductor substrate preparing operation (ST10), a conductive region forming operation (ST20), a dielectric film forming operation (ST30), an electrode forming operation (ST40), and a post-processing operation (ST50). The electrode forming operation (ST40) may include an operation of forming first and second electrode layers (ST42) and a firing operation (ST44). The post-processing operation (ST50) may include a hydrogen diffusion process (ST52), a preliminary heat treatment process (ST54), and a main processing process (ST56). The firing operation (ST44) and the hydrogen diffusion process (ST52) may be simultaneously carried out. The manufacturing method of the solar cell 100 according to the embodiment of the present invention will be described in detail with reference to FIGS. 4A to 4G.

Figure 4A:
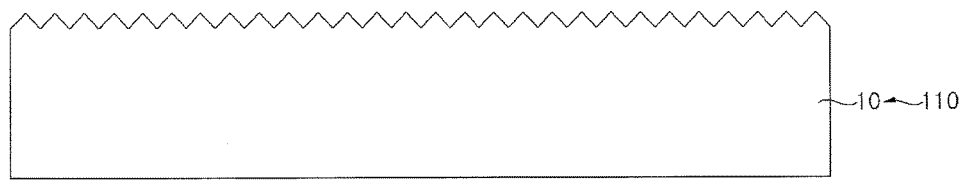
FIGS. 4A to 4G are sectional views showing the manufacturing method of the solar cell shown in FIG. 3 according to an embodiment of the present invention.

First, as shown in FIG. 4A, a semiconductor substrate 110 including a base region 10 having a second conductive dopant is prepared at the semiconductor substrate preparing operation (ST10). For example, in this embodiment of the present invention, the semiconductor substrate 110 may be formed of a silicon substrate (e.g. a silicon wafer) having a p-type dopant (specifically, boron (B)). However, the embodiments of the present invention are not limited thereto. For example, the base region 10 may have a p-type dopant other than boron or an n-type dopant.

At this time, the front surface and/or the back surface of the semiconductor substrate 110 may be textured such that front surface and/or the back surface of the semiconductor substrate 110 has a rugged shape (irregular or textured shape). The surface of the semiconductor substrate 110 may be textured using wet texturing or dry texturing. In the wet texturing, the semiconductor substrate 110 is soaked in a texturing solution. The wet texturing has an advantage in that the process time is short. In the dry texturing, on the other hand, the surface of the semiconductor substrate 110 is cut using a diamond grill or a laser. In the dry texturing, a rugged shape is uniformly formed. However, the process time is long, and the semiconductor substrate 110 may be damaged. Alternatively, the semiconductor substrate 110 may be textured using reactive ion etching (RIE), etc. As described above, the semiconductor substrate 110 may be textured using various methods.

For example, the front surface of the semiconductor substrate 110 may be textured such that the front surface of the semiconductor substrate 110 has a rugged shape, and the back surface of the semiconductor substrate 110 may be mirror-ground to have a lower surface roughness than the front surface of the semiconductor substrate 110. However, the embodiments of the present invention are not limited thereto. The semiconductor substrate 110 may have various other structures.

Figure 4B:
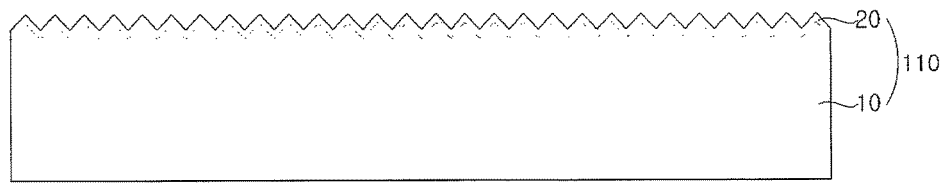

Subsequently, as shown in FIG. 4B, a conductive region is formed at the semiconductor substrate 110 at the conductive region forming operation (ST20). More specifically, in this embodiment of the present invention, a first conductive region 20 is formed at the front surface of the semiconductor substrate 110 at the conductive region forming operation, and a second conductive region 30 (see FIG. 4E), which will be positioned at the back surface of the semiconductor substrate 110, is formed at a subsequent operation of firing a second electrode 44. However, the embodiments of the present invention are not limited thereto. For example, the first conductive region 20 and/or the second conductive region 30 may be formed at the conductive region forming operation. In this case, the second conductive region 30 may be formed using a method identical to or similar to a method of forming the first conductive region 20, which will hereinafter be described.

The first conductive region 20 may be formed by doping a dopant using various methods, such as ion injection, thermal diffusion, and laser doping. In another example, an additional layer having a first conductive dopant may be formed on the semiconductor substrate 110 to form the first conductive region 20.

Figure 4C:
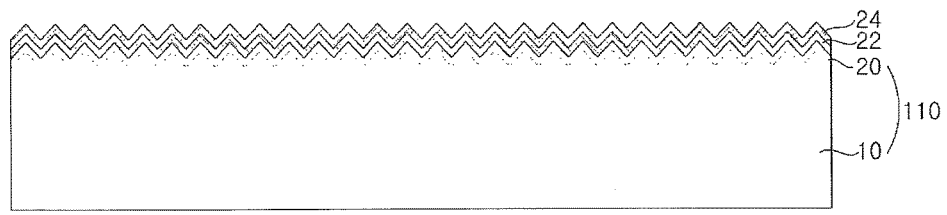

Subsequently, as shown in FIG. 4C, a dielectric film is formed on the front surface of the semiconductor substrate 110 or on the first conductive region 20 at the dielectric film forming operation (ST30).

More specifically, a first passivation film 22 and an anti-reflection film 24 are formed on the first conductive region 20. In this embodiment of the present invention, no dielectric film is positioned at the back surface of the semiconductor substrate 110. Alternatively, another dielectric film (e.g. a second passivation film) may be positioned at the back surface of the semiconductor substrate 110. The dielectric film may also be formed at the back surface of the semiconductor substrate 110 at this operation. In this case, the dielectric film may also be formed on the back surface of the semiconductor substrate 110 using a method identical to or similar to a method of forming the first passivation film 22 and the anti-reflection film 24, which will hereinafter be described.

The first passivation film 22 and/or the anti-reflection film 24 may be formed using various methods, such as vacuum deposition, chemical vapor deposition, spin coating, screen printing, and spray coating.

In this embodiment of the present invention, the first passivation film 22 may be formed of a dielectric material including hydrogen. As a result, the first passivation film 22 may function to passivate the surface of the semiconductor substrate 110 using hydrogen and, in addition, function as a hydrogen source for supplying hydrogen to the semiconductor substrate 110 at the post-processing operation (ST50).

Figure 4D:
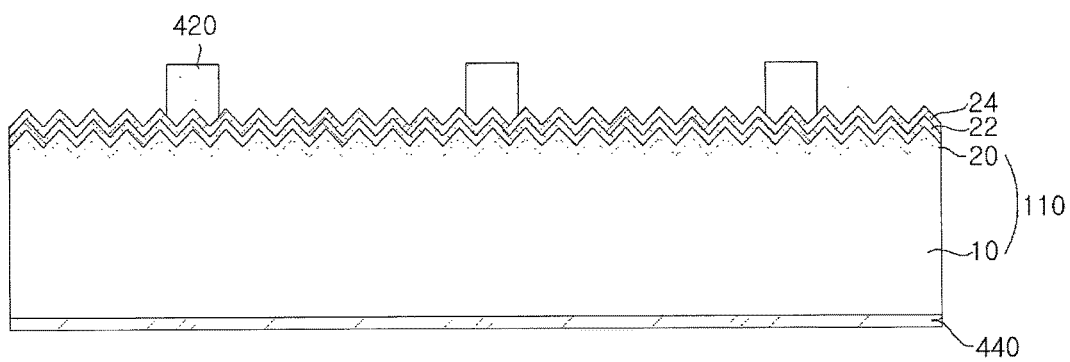
Figure 4E:
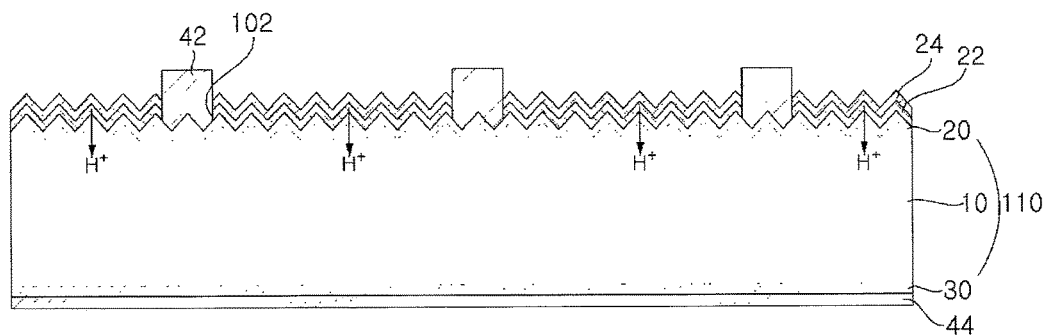

Subsequently, as shown in FIGS. 4D and 4E, first and second electrodes 42 and 44 are formed at the electrode forming step (ST40), which will hereinafter be described in more detail.

First, as shown in FIG. 4D, a paste for forming first and second electrodes is applied onto the dielectric films, such as the first passivation film 22 and the anti-reflection film 24, or the semiconductor substrate 110 by printing (e.g. screen printing) to form first and second electrode layers 420 and 440 at the operation of forming the first and second electrode layers (ST42). The first and second electrode layers 420 and 440 may be formed using various other methods or processes.

Subsequently, as shown in FIG. 4E, the first and second electrode layers 420 and 440 are fired to form first and second electrodes 42 and 44 at the firing operation (ST44).

During firing, an opening 102 is formed through the dielectric films, such as the first passivation film 22 and the anti-reflection film 24, by firing through or laser firing contact with the result that the first electrode layer 420 is connected to (e.g. contacts) the first conductive region 20. In an instance in which the firing through or the laser firing contact is used as described above, the opening 102 is formed during firing. As a result, it is not necessary to carry out an additional process of forming the opening 102.

In addition, a material (e.g. aluminum) constituting the second electrode 44 may be diffused to the back surface of the semiconductor substrate 110 to form the second conductive region 30 at the semiconductor substrate 110. However, the embodiments of the present invention are not limited thereto. For example, the second conductive region 30 may be formed at the conductive region forming operation (ST20) as previously described.

For example, at the firing operation (ST44), temperature (specifically, peak temperature) may be 700 to 800° C., and process time may be 5 to 20 seconds. These conditions are limited to a range in which process time can be minimized while firing is sufficiently achieved. However, the embodiments of the present invention are not limited thereto. In addition, the firing operation (ST44) may be carried out using heat generated from an ultraviolet lamp. However, the embodiments of the present invention are not limited thereto. Various other methods may also be used.

As described above, in this embodiment of the present invention, the electrode forming operation (ST40) includes the firing operation (ST44). The firing operation (ST44) may be a part of the post-processing operation (S50), which will be subsequently carried out. That is, the firing operation (ST44) and a part of the post-processing operation (S50) may be simultaneously carried out, which will hereinafter be described in more detail when describing the post-processing operation (S50).

However, the embodiments of the present invention are not limited thereto. The electrode forming operation (ST40) may not include the firing operation (ST44). For example, the opening 102 may be formed through the first passivation film 22 and the anti-reflection film 24, the opening 102 may be filled with a conductive material using various methods, such as plating and deposition, to form the first electrode 42, and the second electrode 44 may be formed using various methods, such as plating, deposition, and printing. In addition, the first electrode 42 and the second electrode 44 may be formed using various other methods.

Subsequently, the post-processing operation (S50) is carried out to post-process the solar cell 100 including the semiconductor substrate 110 by passivating the semiconductor substrate 110. More specifically, the post-processing operation (S50) is carried out to prevent lowering in characteristics of the solar cell 100 which may be caused due to a specific combination generated at the surface of the semiconductor substrate 110 or in the bulk of the semiconductor substrate 110. For example, in an instance in which the semiconductor substrate 110 includes boron, the B—O combination may be easily generated in the semiconductor substrate 110 when light is supplied to the semiconductor substrate 110. Such a B—O combination may greatly reduce the lifetime of the carriers, thereby lowering the characteristics of the solar cell 100. In this embodiment of the present invention, therefore, the post-processing operation (S50) is carried out such that specific combination (e.g. the B—O combination) which may lower the characteristics of the solar cell 100 is not generated in the semiconductor substrate 110 as described above, thereby improving the characteristics of the solar cell 100.

In an instance in which the semiconductor substrate 110 is heat-treated at a high temperature after the post-processing operation (S50), the effects obtained by the post-processing operation (S50) may be lowered or disappear. For this reason, the post-processing operation (S50) may be carried out in the second half of the manufacturing method of the solar cell 100. Specifically, the post-processing operation (S50) may be carried out simultaneously with the firing operation (ST44) or after the firing operation (ST44), which is carried out at a relatively high temperature. For example, a part of the post-processing operation (S50) may be carried out simultaneously with the firing step (ST44), and the rest of the post-processing operation (S50) may be carried out after the firing operation (ST44). Alternatively, the entirety of the post-processing operation (S50) may be carried out after the firing operation (ST44). As a result, the effects obtained by the post-processing operation (S50) may not be lowered or disappear. The post-processing operation (S50) will hereinafter be described in more detail.

The post-processing operation (S50) includes the main processing process (ST56), which is capable of restraining generation of combination lowering the characteristics of the solar cell 100 and generating combination (e.g. a B—H combination) which may not badly or adversely affect the characteristics of the solar cell 100 through heat treatment of the semiconductor substrate together with the supply of light to the semiconductor substrate. In addition, the post-processing operation (S50) may further include the hydrogen diffusion process (ST52) and/or the preliminary heat treatment process (ST54), which are carried out before the main processing process (ST56), for improving the effects of the main processing process (ST56). In this embodiment of the present invention, the hydrogen diffusion process (ST52), the preliminary heat treatment process (ST54), and the main processing process (ST56) are sequentially carried out to maximize the effects of the post-processing operation (S50). Hereinafter, the hydrogen diffusion process (ST52), the preliminary heat treatment process (ST54), and the main processing process (ST56) will be described in detail.

First, hydrogen is diffused in the semiconductor substrate 110 at the hydrogen diffusion process (ST52). At the hydrogen diffusion process (ST52), the semiconductor substrate 110 is heat-treated at a high temperature at which hydrogen is diffused deeply in the semiconductor substrate 110.

At this time, hydrogen may be supplied from various hydrogen sources to the semiconductor substrate 110. For example, the semiconductor substrate 110 may be placed in a furnace under a hydrogen atmosphere such that hydrogen in the hydrogen atmosphere can be supplied into the semiconductor substrate 110. In this case, the hydrogen in the hydrogen atmosphere is a hydrogen source. Alternatively, in an instance in which the dielectric films (i.e. the first passivation film 22 and the anti-reflection film 24) formed on the semiconductor substrate 110 include hydrogen, the hydrogen from the dielectric films may be supplied into the semiconductor substrate 110 by heat treatment. In this case, the hydrogen in the dielectric films is a hydrogen source.

In this embodiment of the present invention, the dielectric films, specifically the first passivation film 22 contacting the semiconductor substrate 110, include hydrogen, and the hydrogen is supplied into the semiconductor substrate 110. In an instance in which the first passivation film 22 is used as a hydrogen source as described above, it is not necessary to provide a process or an apparatus for forming the hydrogen atmosphere. In addition, the first passivation film 22 may function as a kind of capping film for further accelerating the diffusion of hydrogen in the semiconductor substrate 110.

The hydrogen diffusion process (ST52) may be carried out at a temperature (more exactly, a peak temperature) of 400 to 800° C. (more specifically, 400 to 700° C.) for 5 seconds to 20 minutes (more specifically, 1 to 20 minutes). If the temperature of the hydrogen diffusion process (ST52) is less than 400° C. or the process time is less than 5 seconds, hydrogen diffusion may not be sufficiently achieved. On the other hand, if the temperature of the hydrogen diffusion process (ST52) is greater than 800° C. or the process time is greater than 20 minutes, a process cost and time are increased, thereby lowering productivity. In other words, hydrogen may be effectively diffused in the semiconductor substrate 110 within the above-defined temperature and time ranges, thereby achieving high productivity. In consideration of the process cost and the productivity, the temperature of the hydrogen diffusion process (ST52) may be 400 to 700° C. In consideration of the hydrogen diffusion, on the other hand, the process time may be 1 to 20 minutes. However, the embodiments of the present invention are not limited thereto. The temperature and the process time of the hydrogen diffusion process (ST52) may be variously changed.

At this time, various heat source units which are capable of uniformly maintaining the temperature of the hydrogen diffusion process (ST52) may be used. For example, an ultraviolet lamp or a resistance heating type heater may be used as a heat source unit. However, the embodiments of the present invention are not limited thereto. Various other heat source units may be used.

The temperature and the process time of the hydrogen diffusion process (ST52) may be equal to, similar to, or overlap with those of the firing operation (ST44) of the electrode forming operation (ST40). In addition, heat source units used at the hydrogen diffusion process (ST52) and the firing operation (ST44) may be identical to or similar to each other. Consequently, the hydrogen diffusion process (ST52) may be carried out simultaneously with the firing operation (ST44). That is, as shown in FIG. 4E, hydrogen diffusion may be achieved at the firing operation (ST44) without additionally carrying out the hydrogen diffusion process (ST52). Since the hydrogen diffusion process (ST52) is not additionally carried out, the process may be simplified, and process cost may be reduced. However, the embodiments of the present invention are not limited thereto. For example, the hydrogen diffusion process (ST52) may be carried out as a separate operation after the firing operation (ST44).

Figure 4F:
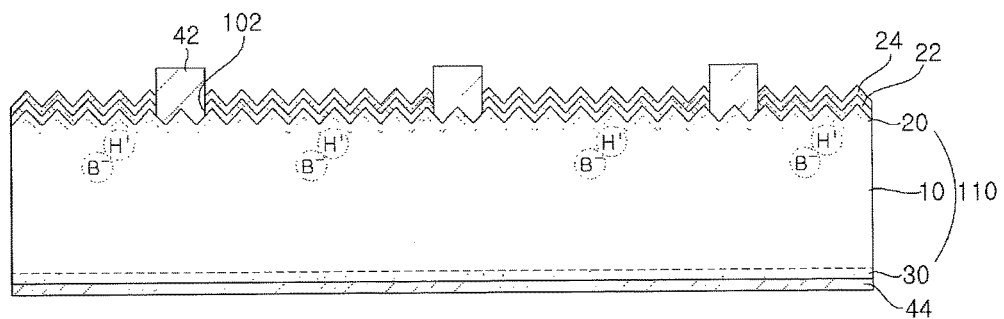

Subsequently, as shown in FIG. 4F, the preliminary heat treatment process (ST54) may be carried out to heat-treat the semiconductor substrate 110 such that hydrogen diffused in the semiconductor substrate 110 can react with a different material and element in the semiconductor substrate 110 to generate a combination including the hydrogen. In particular, the hydrogen may be combined with the dopant of the semiconductor substrate 110. For example, in an instance in which the semiconductor substrate 110 includes boron as a dopant, the B—H combination, in which hydrogen and boron are combined with each other, may be generated.

At the preliminary heat treatment process (ST54), only heat treatment is carried out without additional supply of light to the semiconductor substrate with the result that the B—O combination is not generated but the B—H combination is generated. As described above, no light is supplied at the preliminary heat treatment process (ST54). Even in an instance in which natural light is supplied, the light has a light intensity of about 100 mW/cm$^2$, which is lower than that of the main processing process (ST56). However, the embodiments of the present invention are not limited thereto. The light intensity of the preliminary heat treatment process (ST54) may be changed.

The temperature of the preliminary heat treatment process (ST54) may be 100 to 300° C., which is lower than that of the hydrogen diffusion process (ST52). As previously described, the preliminary heat treatment process (ST54) is carried out to generate the B—H combination. If the temperature of the preliminary heat treatment process (ST54) is less than 100° C., no energy for the B—H combination is provided with the result that the B—H combination may not be satisfactorily generated. On the other hand, if the temperature of the preliminary heat treatment process (ST54) is greater than 300° C., hydrogen combination is superior to the B—H combination. As a result, hydrogen combination may be generated, and the B—H combination may be decomposed. In an instance in which the temperature of the preliminary heat treatment process (ST54) is 100 to 300° C., therefore, it is possible to generate a large amount of the B—H combination through the preliminary heat treatment process (ST54).

The process time of the preliminary heat treatment process (ST54) may be 1 to 30 minutes. If the process time of the preliminary heat treatment process (ST54) is less than 1 minute, it may be difficult to sufficiently generate the desired B—H combination. On the other hand, if the process time of the preliminary heat treatment process (ST54) is greater than 30 minutes, the process time may be increased while the effects obtained through preliminary heat treatment are not greatly improved, thereby lowering productivity. However, the embodiments of the present invention are not limited thereto. The process time of the preliminary heat treatment process (ST54) may be changed.

In an instance in which the B—H combination is generated through the preliminary heat treatment process (ST54) as described above, hydrogen exists near the surface of the semiconductor substrate 110 or in the semiconductor substrate 110 in a state in which the hydrogen is combined with boron (B), which is the dopant of the semiconductor substrate 110. In particular, a large amount of the B—H combination exists near the surface of the semiconductor substrate 110. As a result, the diffusion distance and time of hydrogen into the semiconductor substrate 110 may be reduced at the main processing process (ST56), which will be subsequently carried out.

Figure 4G:
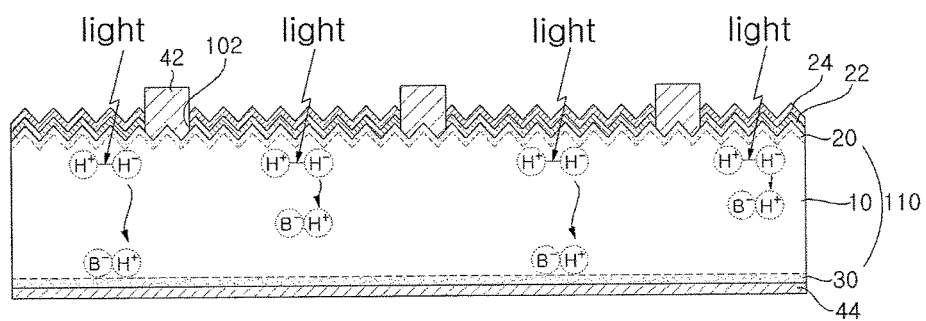

Subsequently, as shown in FIG. 4G, the semiconductor substrate 110 is heat-treated at a temperature higher than a room temperature in a state in which light is supplied to the semiconductor substrate 110 at the main processing process (ST56). In an instance in which light is supplied to the semiconductor substrate 110 at the main processing process (ST56), hydrogen may not be in an H$^+$ state, in which the hydrogen is stable, but may be in an H$^0$ or H$^-$ state, in which the hydrogen is unstable, even during a short time by carrier injection from the light. Since the hydrogen in the H$^0$ or H$^-$ state is not stable, the state of the hydrogen may be converted into the H$^+$ state, in which the hydrogen is stable, after a predetermined time.

Since the diffusion speed of the hydrogen in the H$^0$ or H$^-$ state generated by the light is much greater than that of the hydrogen in the H$^+$ state, the hydrogen may be rapidly diffused in the semiconductor substrate 110. Consequently, the hydrogen is uniformly distributed in the semiconductor substrate 110 with the result that the hydrogen functions to remove defects in the semiconductor substrate 110 or to prevent or reduce generation of undesired combination in the semiconductor substrate 110. For example, in an instance in which the hydrogen in the H$^0$ or H$^-$ state is diffused in the semiconductor substrate 110 and is then converted into the H$^+$ state, in which the hydrogen is stable, the B—H combination is generated, thereby preventing or reducing generation of the B—O combination. That is, the B—O combination, which may generated at the beginning of the main processing process (ST56) due to light emitted to the semiconductor substrate 110, may be decomposed to generate B—H combination. After that, the B—H combination is generally predominant in the semiconductor substrate 110 with the result that the B—O combination is not generated. As described above, the B—H combination, which is distributed at the surface of the semiconductor substrate 110, may be uniformly distributed in the semiconductor substrate 110, thereby preventing or reducing generation of the undesired B—O combination in the semiconductor substrate 110.

In this embodiment of the present invention, it is necessary to provide the temperature, the light intensity, and the time based on a predetermined relationship thereamong so as to convert the hydrogen in the H$^+$ state into the hydrogen in the H$^0$ or H$^-$ state, and to concretely define the relationship so as to maximize the effects of the main processing process (ST56). That is, if a predetermined light intensity and/or process time is not provided although light is supplied to the semiconductor substrate at a uniform temperature, hydrogen exists in the H$^+$ state, in which the hydrogen is stable. Only when the predetermined light intensity and/or process time is provided, the state of the hydrogen may be converted into the $H^0$ or $H^-$ state.

Figure 5:
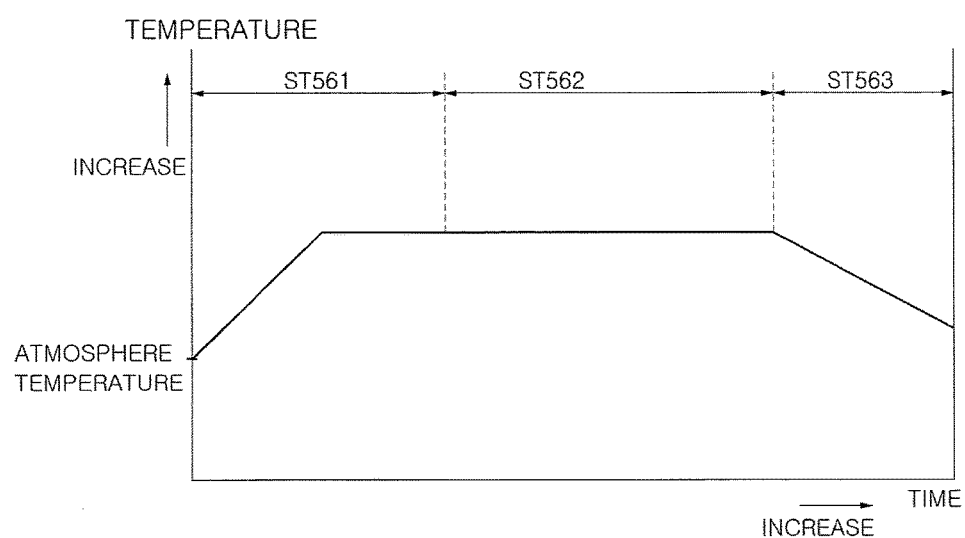
FIG. 5 is a graph showing a relationship between time and temperature of a main processing process of a post-processing operation of the manufacturing method of the solar cell according to the embodiment of the present invention.

At this time, the main processing process (ST56) may be carried out to have a time-temperature graph as shown in FIG. 5. FIG. 5 is a graph showing a relationship between time and temperature of the main processing process of the post-processing operation of the manufacturing method of the solar cell according to the embodiment of the present invention.

That is, as shown in FIG. 5, the main processing process (ST56) may include a main period (ST562) having a temperature (more specifically, a peak temperature) for hydrogen conversion. The main processing process (ST56) may further include a temperature rising period (ST561) for increasing the temperature from the room temperature to the temperature of the main period, the temperature rising period (ST561) being carried out before the main period (ST562), and a cooling period (ST563) for decreasing the temperature to the room temperature, the cooling period (ST563) being carried out after the main period (ST562). During the main processing process (ST56), therefore, the occurrence of problems caused due to abrupt change of temperature may be prevented, and a desired reaction may be stably achieved. In this embodiment of the present invention, the temperature of the main processing process (ST56) means that of the main period (ST562), in which hydrogen conversion is actually achieved. The light intensity of the main processing process (ST56) may mean that of the main period (ST562), and the process time of the main processing process (ST56) may mean that of the main period (ST562), in which hydrogen conversion is actually achieved.

It is necessary that the temperature of the main processing process (ST56) be sufficient to convert hydrogen in an $H^+$ state into hydrogen in an $H^0$ or $H^-$ state and to decompose the B—O combination which may be generated due to the supply of light. For example, the temperature of the main processing process (ST56) may be 100 to 800° C. If the temperature of the main processing process (ST56) is less than 100° C., thermal energy is less than energy necessary to decompose the B—O combination with the result that the B—O combination generated due to the supply of light may survive. On the other hand, if the temperature of the main processing process (ST56) is greater than 800° C., a process cost may be increased due to the high temperature. However, the embodiments of the present invention are not limited thereto.

First, a relationship between temperature and light intensity of the main processing process (ST56) for converting hydrogen in an $H^+$ state into hydrogen in an $H^0$ or $H^-$ state will be described before a relationship between light intensity and time of the main processing process (ST56) will be described.

Figure 6:
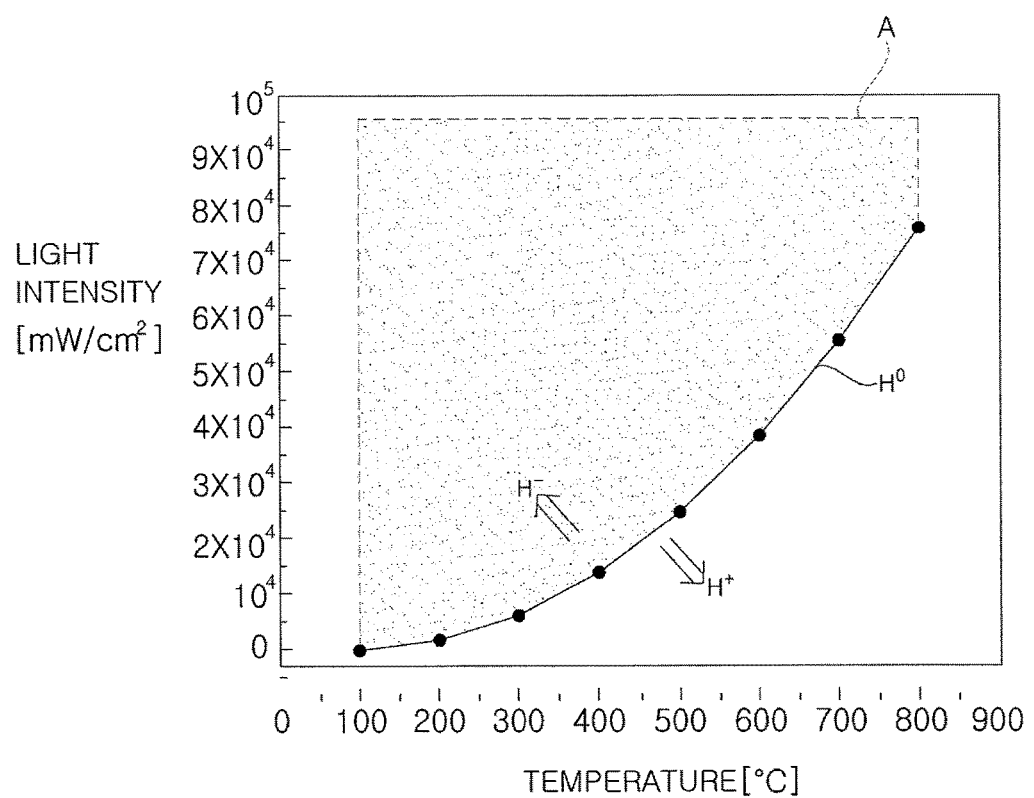
FIG. 6 is a graph showing a state of hydrogen based on a relationship between temperature and light intensity at the post-processing operation of the manufacturing method of the solar cell according to the embodiment of the present invention.

FIG. 6 is a graph showing a state of hydrogen based on a relationship between temperature and light intensity at the post-processing operation of the manufacturing method of the solar cell according to the embodiment of the present invention.

A relationship between temperature and light intensity was analyzed based on the fact that the minimum value $I_{min}$ of the light intensity necessary for hydrogen conversion varies according to temperature T of the main processing process (ST56). The results were obtained as shown in FIG. 6. It can be seen from FIG. 6 that the minimum value $I_{min}$ of the light intensity increases as the temperature T of the main processing process (ST56) increases. In this embodiment of the present invention, therefore, the minimum value $I_{min}$ of the light intensity per temperature T is represented by Equation 1.

$$I_{min}=1750-31.8 \cdot T+(0.16) \cdot T^2 \qquad \text{<Equation 1>}$$

where the unit of T is ° C., and the unit of $I_{min}$ is $mW/cm^2$.

Only in an instance in which light intensity I of light supplied simultaneously with heat treatment is equal to or greater than the minimum value $I_{min}$ of the light intensity on the assumption that the temperature T of the main processing process (ST56) has a uniform value, therefore, the state of the hydrogen may be converted into the $H^0$ or $H^-$ state. For reference, in an instance in which the temperature T is 100 to 800° C., the minimum value $I_{min}$ of the light intensity may be $1.7 \times 10^2$ $mW/cm^2$ to $7.871 \times 10^4$ $mW/cm^2$.

Consequently, the light intensity I of the light to be supplied based on the temperature T of the main processing process (ST56) may satisfy the conditions of Equation 2.

$$1750-31.8 \cdot T+(0.16) \cdot T^2 \leq I \qquad \text{<Equation 2>}$$

where the unit of T is ° C., and the unit of I is $mW/cm^2$.

In an instance in which the light intensity I of the light satisfying Equation 2 is provided at a specific temperature T of the main processing process (ST56), therefore, hydrogen in the H+ state may be converted into hydrogen in the $H^0$ or $H^-$ state. At this time, it may be difficult to acquire a desired value of the light intensity I of the light if the light intensity I is excessively high. The light intensity I may have a value of $10^5$ $mW/cm^2$ within a range of the temperature T of the main processing process (ST56). Consequently, the light intensity I to be provided based on the temperature T of the main processing process (ST56) may satisfy the conditions of Equation 3.

$$1750-31.8 \cdot T+(0.16) \cdot T^2 \leq I \leq 10^5 \qquad \text{<Equation 3>}$$

where the unit of T is ° C., and the unit of I is $mW/cm^2$.

The above-described range of the temperature T and the ranges of the temperature T and the light intensity I satisfying Equation 3 approximately correspond to a region denoted by A in FIG. 6.

Figure 7:
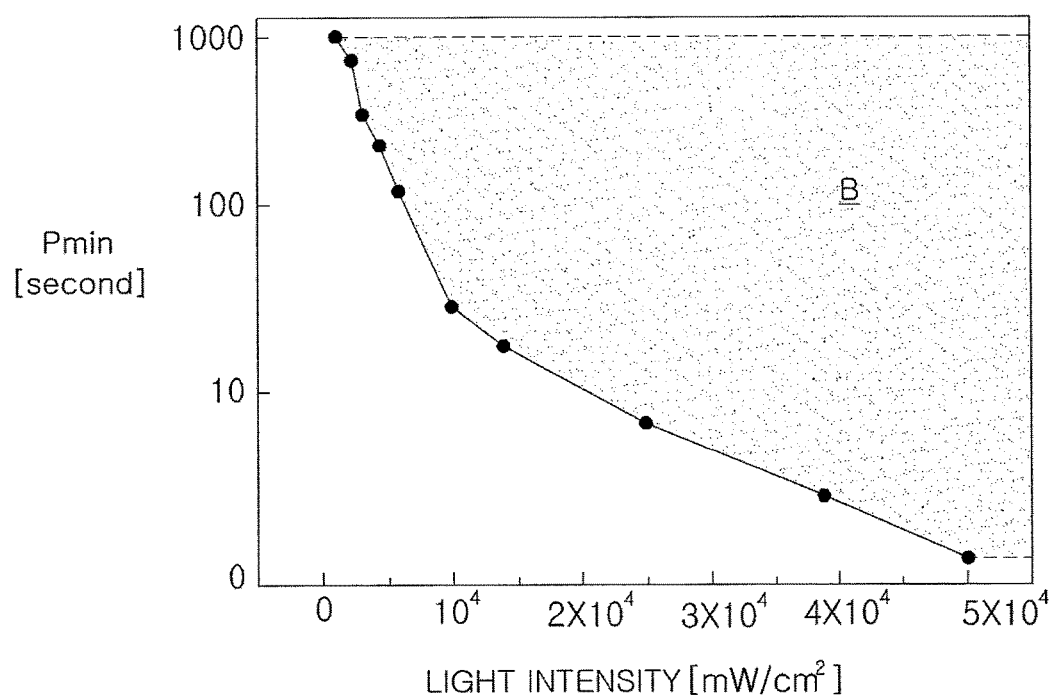
FIG. 7 is a graph showing a state of hydrogen based on a relationship between light intensity and process time at the post-processing operation of the manufacturing method of the solar cell according to the embodiment of the present invention.

A relationship between light intensity and process time was analyzed based on the fact that the minimum value $P_{min}$ of the process time necessary for hydrogen conversion (the minimum process time necessary to convert hydrogen in the H+ state into hydrogen in the $H^0$ state) varies according to the light intensity I of the main processing process (ST56). The results were obtained as shown in FIG. 7. FIG. 7 is a graph showing a state of hydrogen based on a relationship between light intensity and process time at the post-processing operation of the manufacturing method of the solar cell according to the embodiment of the present invention.

As shown in FIG. 7, the minimum value $P_{min}$ of the process time decreases as the light intensity I increases. That is, in an instance in which the light intensity I is high, a relatively short process time is needed. On the other hand, in an instance in which the light intensity I is low, a relatively long process time is needed. In this embodiment of the present invention, the minimum value $P_{min}$ of the process time based on the light intensity I approximately corresponds to Equations 4 to 7. In an instance in which the light intensity I is $5 \times 10_4$ $mW/cm^2$ or more as represented by Equation 7, the minimum process time is greatly decreased with the result that it is difficult to perform arithmetic calculation. In addition, it is difficult to carry out the process within the decreased process time. For this reason, it is assumed that the minimum value $P_{min}$ of the process time is uniform for the above-mentioned light intensity I.

$1.7 \times 10^2 \leq I < 10^3$, and $P_{min} = 13000 - (31.7) \cdot I + (0.02) \cdot (I)^2$ <Equation 4>

$10^3 \leq I < 10^4$, and $P_{min} = 1030 - (0.25) \cdot I + (1.5 \times 10^{-5}) \cdot (I)^2$ <Equation 5>

$10^4 \leq I \leq 5 \times 10^4$, and $P_{min} = 35.5 - (0.0012) \cdot I + (10^{-8}) \cdot (I)^2$ <Equation 6>

$5 \times 10^4 \leq I \leq 10^5$, and $P_{min} = 0.5$ <Equation 7> where the unit of I is mW/cm², and the unit of $P_{min}$ is sec.

In an instance in which the process time P of the main processing process (ST56) is equal to or greater than the minimum value $P_{min}$ of the process time when the light intensity I of the main processing process (ST56) has a uniform value, therefore, the state of the hydrogen may be effectively converted into the H⁰ or H⁻ state. Consequently, the process time P of the main processing process (ST56) based on the light intensity I may satisfy any one of Equations 8 to 11.

$1.7 \times 10^2 \leq I < 10^3$, and $13000 - (31.7) \cdot I + (0.02) \cdot (I)^2 \leq P$ <Equation 8>

$10^3 \leq I < 10^4$, and $1030 - (0.25) \cdot I + (1.5 \times 10^{-5}) \cdot (I)^2 \leq P$ <Equation 9>

$10^4 \leq I \leq 5 \times 10^4$, and $35.5 - (0.0012) \cdot I + (10^{-8}) \cdot (I)^2 \leq P$ <Equation 10>

$5 \times 10^4 \leq I \leq 10^5$, and $0.5 \leq P$ <Equation 11> where the unit of $I_{min}$ is MW/cm² and the unit of P is sec.

In an instance in which the process is carried out with the light intensity I of the main processing process (ST56) during the process time P satisfying Equations 8 to 11, therefore, it is possible to convert the hydrogen in the H⁺ state into the hydrogen in the H⁰ or H⁻ state. At this time, productivity may be lowered if the process time P is excessively long. For this reason, the process time P of the main processing process (ST56) may have a value of 10,000 sec or less. Consequently, the process time P of the main processing process (ST56) based on the light intensity I may satisfy any one of Equations 12 to 15.

$1.7 \times 10^2 \leq I < 10^3$, and $13000 - (31.7) \cdot I + (0.02) \cdot (I)^2 \leq P \leq 10000$ <Equation 12>

$10^3 \leq I < 10^4$, and $1030 - (0.25) \cdot I + (1.5 \times 10^{-5}) \cdot (I)^2 \leq P \leq 10000$ <Equation 13>

$10^4 \leq I \leq 5 \times 10^4$, and $35.5 - (0.0012) \cdot I + (10^{-8}) \cdot (I)^2 \leq P \leq 10000$ <Equation 14>

$5 \times 10^4 \leq I \leq 10^5$, and $0.5 \leq P \leq 10000$ <Equation 15>

The ranges of the light intensity I and the process time P satisfying Equations 12 to 15 approximately correspond to a region denoted by B in FIG. 7.

As described above, in this embodiment of the present invention, the ranges of the temperature T and the light intensity I of the main processing process (ST56) are defined to achieve hydrogen conversion. In addition, the range of the process time P is also defined to effectively achieve hydrogen conversion. Consequently, it is possible to effectively prevent lowering in characteristics of the semiconductor substrate 110 which may be caused in the semiconductor substrate 110 when light is emitted to the semiconductor substrate 110.

As described above, in this embodiment of the present invention, the post-processing operation (ST50) includes the main processing process (ST56) which is carried out at predetermined ranges of the temperature T and the light intensity I, thereby preventing undesired combination (e.g. the B—O combination), which may lower the characteristics of the solar cell 100, from being generated in the semiconductor substrate 110 and, instead, generating combination including hydrogen (e.g. the B—H combination) in the semiconductor substrate 110. Consequently, it is possible to prevent lowering in characteristics of the solar cell 100 due to undesired combination. At this time, the process time P of the main processing process (ST56) may be defined to be within a predetermined range to more effectively prevent generation of undesired combination.

In addition, the hydrogen diffusion process (ST52) for diffusing hydrogen and/or the preliminary heat treatment process (ST54) for generating combination including hydrogen (e.g. the B—H combination) may be further carried out before the main processing process (ST56) to further improve the effects of the post-processing operation (ST50).

In the above description, the base region 10 of the semiconductor substrate 110 includes boron (B). Alternatively, the first conductive region 20 may include boron (B). Even in an instance in which the semiconductor substrate 110 does not include boron (B), combination including hydrogen (e.g. the B—H combination) may be generated in the semiconductor substrate 110, thereby improving the characteristics of the solar cell 100.

In addition, the manufacturing method of the solar cell 100 according to the embodiment of the present invention may be applied to manufacture of a solar cell 100 including a semiconductor substrate 110 having a crystalline structure. Such a solar cell 100 will hereinafter be described in detail with reference to FIGS. 8 and 9. Parts identical to or similar to those of the solar cell according to the previous embodiment of the present invention may be equally applied to the following embodiments of the present invention, and therefore a detailed description thereof will be omitted.

Figure 8:
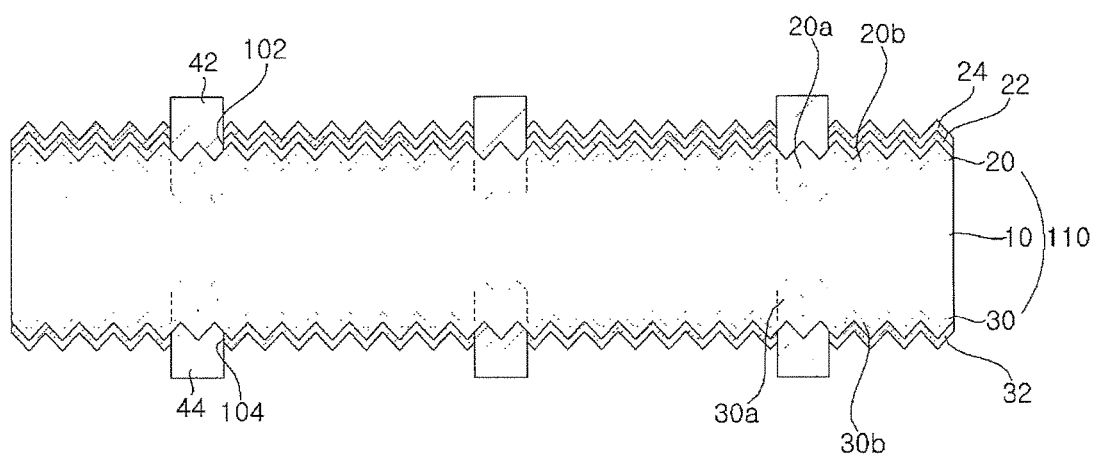
FIG. 8 is a sectional view showing another example of the solar cell manufactured using the manufacturing method of the solar cell according to the embodiment of the present invention.

FIG. 8 is a sectional view showing another example of the solar cell manufactured using the manufacturing method of the solar cell according to the embodiment of the present invention.

Referring to FIG. 8, the solar cell according to this embodiment is configured such that a second passivation film 32 is formed on a back surface of a semiconductor substrate 110, and a second electrode 44 is connected to a second conductive region 30 through the second passivation film 32 (i.e. via an opening 104).

The second passivation film 32 may be substantially formed throughout the back surface of the semiconductor substrate 110 excluding the opening 104 corresponding to the second electrode 44. The second passivation film 32 is formed at the second conductive region 30 in contact to passivate defects existing on the surface of the second conductive region 30 or in a bulk of the second conductive region 30. The passivation of defects may remove a recombination site of minority carriers, which may increase an open-circuit voltage Voc of the solar cell 100.

The second passivation film 32 may be formed of various materials. For example, the second passivation film 32 may be formed of a dielectric material including hydrogen. In an instance in which the second passivation film 32 includes hydrogen as described above, the second passivation film 32 may function to passivate the surface of the semiconductor substrate 110 and, in addition, function as a hydrogen source for supplying hydrogen to the surface of the semiconductor substrate 110 or into a bulk of the semiconductor substrate 110 at a post-processing operation (ST50) (see FIG. 3).

For example, the second passivation film 32 may include $10^{20}$ to $10^{22}$ ea/cm³ of hydrogen. The hydrogen content of the second passivation film 32 is limited to a range in which the second passivation film 32 can effectively function as the hydrogen source when the second passivation film 32 passivates the surface of the semiconductor substrate 110 and at the post-processing operation (ST50). However, the embodiments of the present invention are not limited thereto. The hydrogen content of the second passivation film 32 may be variously changed.

For example, the second passivation film 32 may include a silicon nitride (SiNx:H) including hydrogen, a silicon oxide nitride (SiOxNy:H) including hydrogen, a silicon carbide (SiCx:H) including hydrogen, or a silicon oxide (SiOx:H) including hydrogen. However, the embodiments of the present invention are not limited thereto. The second passivation film 32 may include various other materials.

As described above, in this embodiment of the present invention, both the first passivation film 22 formed at the front surface of the semiconductor substrate 110 and the second passivation film 32 formed at the back surface of the semiconductor substrate 110 function as a hydrogen source at the post-processing operation (ST50), thereby doubling the effects of the post-processing operation (ST50).

However, the embodiments of the present invention are not limited thereto. The second passivation film 32 may include various materials. Alternatively, only the second passivation film 32 may include hydrogen, and the first passivation film 22 may not include hydrogen. In addition, various films may be formed on the back surface of the semiconductor substrate 110 in addition to the second passivation film 32. Various other modifications are also possible.

The second electrode 44 is electrically connected to the second conductive region 30 via the opening 104 formed through the second passivation film 32. The second electrode 44 may be formed of various materials such that the second electrode 44 can have various shapes.

For example, the second electrode 44 may have a planar shape identical to or similar to that of the first electrode 42 previously described with reference to FIGS. 1 and 2. Consequently, the semiconductor substrate 110 has a bifacial structure in which light is incident upon both the front surface and the back surface of the semiconductor substrate 110. As a result, the quantity of light used for photoelectric conversion is increased, thereby improving the efficiency of the solar cell 100. The width and pitch of finger electrodes and bus bar electrodes of the second electrode 44 may be equal to or different from those of the finger electrodes 42a and bus bar electrodes 42b of the first electrode 42.

In another example, the second electrode 44 may be formed throughout the second passivation film 32 and may be connected to the back surface of the semiconductor substrate 110 or the second conductive region 30 in point contact via the opening 104. In this case, the back surface of the semiconductor substrate 10 is not textured. That is, no rugged shape is formed at the back surface of the semiconductor substrate 10. Consequently, light may be effectively reflected by the second electrode 44 formed throughout the second passivation film 32. Various other modifications are also possible.

In this embodiment of the present invention, not only the first conductive region 20 has a selective structure but also the second conductive region 30 has a selective structure.

That is, the first conductive region 20 may include a first part 20a formed adjacent to (e.g. in contact with) the first electrode 42 and a second part 20b formed at a region where the first electrode 42 is not positioned. The first part 20a has a relatively high dopant concentration and a relatively large junction depth. Consequently, the first part 20a exhibits relatively low resistance. On the other hand, the second part 20b has a lower dopant concentration and a smaller junction depth than the first part 20a. Consequently, the second part 20b exhibits higher resistance than the first part 20a.

As described above, in this embodiment of the present invention, the first part 20a having relatively low resistance may be formed at a part adjacent to the first electrode 42 to reduce contact resistance with the first electrode 42. In addition, the second part 20b having relatively high resistance may be formed at a part corresponding to a light receiving region, upon which light is incident, between the first electrodes 42 to constitute a shallow emitter. Consequently, it is possible to improve current density of the solar cell 100. That is, in this embodiment of the present invention, the first conductive region 20 may have a selective structure, thereby maximizing the efficiency of the solar cell 100.

In addition, the second conductive region 30 may include a first part 30a formed adjacent to (e.g. in contact with) the second electrode 44 and a second part 30b formed at a region where the second electrode 44 is not positioned. The first part 30a has a relatively high dopant concentration and a relatively large junction depth. Consequently, the first part 30a exhibits relatively low resistance. On the other hand, the second part 30b has a lower dopant concentration and a smaller junction depth than the first part 30a. Consequently, the second part 30b exhibits higher resistance than the first part 30a.

As described above, in this embodiment of the present invention, the second part 30a having relatively low resistance may be formed at a part adjacent to the second electrode 44 to reduce contact resistance with the second electrode 44. In addition, the second part 30b having relatively high resistance may be formed at a part corresponding to a region, upon which light is incident, between the second electrodes 44 to prevent recombination between holes and electrons. Consequently, it is possible to improve current density of the solar cell 100. That is, in this embodiment of the present invention, the second conductive region 30 may have a selective structure, thereby maximizing the efficiency of the solar cell 100.

However, the embodiments of the present invention are not limited thereto. The first conductive region 20 and/or the second conductive region 30 may have a homogeneous structure as shown in FIG. 1. Alternatively, the second conductive region 30 may have a local structure which does not include the second part 30b but includes only the second part 30a.

Figure 9:
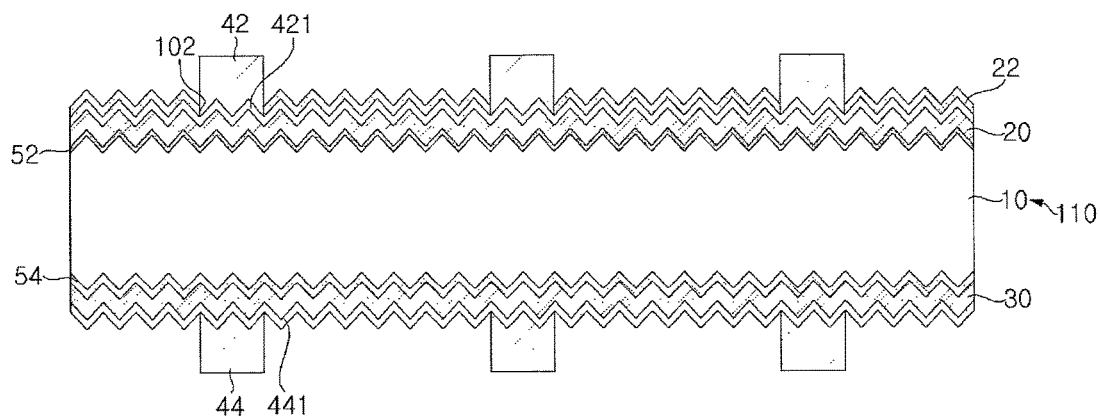
FIG. 9 is a sectional view showing a further example of the solar cell manufactured using the manufacturing method of the solar cell according to the embodiment of the present invention.

FIG. 9 is a sectional view showing a further example of the solar cell manufactured using the manufacturing method of the solar cell according to the embodiment of the present invention.

Referring to FIG. 9, the solar cell according to this embodiment is configured such that conductive regions 20 and 30 are formed on a semiconductor substrate 110 separately from the semiconductor substrate 110 and have a crystalline structure different from that of the semiconductor substrate 110. Consequently, the semiconductor substrate 110 may not include the conductive regions 20 and 30 but include only a base region 10.

More specifically, a first tunneling layer 52 may be formed on the front surface of the semiconductor substrate 110, and the first conductive region 20 may be positioned on the first tunneling layer 52.

The first tunneling layer 52 may improve the passivation characteristics of the front surface of the semiconductor substrate 110, and generated carriers may be smoothly transmitted due to a tunneling effect. The first tunneling layer 52 may include various materials, such as a nitride, a semiconductor, and a conductive polymer, which are capable of tunneling the carriers. For example, the first tunneling layer 52 may include a silicon oxide, a silicon nitride, a silicon oxide nitride, an intrinsic amorphous semiconductor (e.g. intrinsic amorphous silicon), and an intrinsic polycrystalline semiconductor (e.g. intrinsic polycrystalline silicon). In an instance in which the first tunneling layer 52 includes an intrinsic amorphous semiconductor, the semiconductor substrate 110 may be easily manufactured using a simple manufacturing process since the first tunneling layer 52 exhibits characteristics similar to those of the semiconductor substrate 110, thereby more effectively improving the surface characteristics of the semiconductor substrate 110. Consequently, it is possible to prevent surface recombination which may be generated at the surface of the semiconductor substrate 110, thereby improving the passivation characteristics of the semiconductor substrate 110.

The first tunneling layer 52 may be formed throughout the front surface of the semiconductor substrate 110. Consequently, the entirety of the front surface of the semiconductor substrate 110 may be passivated, and the first tunneling layer 52 may be easily formed without additional patterning.

In order to sufficiently achieve the tunneling effect, the first tunneling layer 52 may have a thickness of 5 nm or less. Specifically, the first tunneling layer 52 may have a thickness of 0.5 to 5 nm (e.g. 1 to 4 nm). If the thickness of the first tunneling layer 52 is greater than 5 nm, tunneling may not be satisfactorily achieved with the result that the solar cell 100 may not be operated. On the other hand, if the thickness of the first tunneling layer 52 is less than 0.5 nm, it may be difficult to form the first tunneling layer 52 such that the first tunneling layer 52 has desired quality. In order to further improve the tunneling effect, the first tunneling layer 52 may have a thickness of 1 to 4 nm. However, the embodiments of the present invention are not limited thereto. The thickness of the first tunneling layer 52 may be variously changed.

The first conductive region 20 of a first conductive type, which is opposite to that of the semiconductor substrate 110 or the base region 10, may be formed on the first tunneling layer 52. The first conductive region 20 may form a pn junction (e.g. a pn tunnel junction) together with the semiconductor substrate 110 or the base region 10 to constitute an emitter region for generating carriers through photoelectric conversion.

The first conductive region 20, which is formed on the first tunneling layer 52 separately from the semiconductor substrate 110, may have a crystalline structure different from that of the semiconductor substrate 110. That is, the first conductive region 20 may include an amorphous semiconductor (e.g. amorphous silicon), a micro-crystalline semiconductor (e.g. micro-crystalline silicon), or a polycrystalline semiconductor (e.g. polycrystalline silicon), which may be easily formed on the first conductive region 20 using various methods, such as deposition. Consequently, the first conductive region 20 may be formed of an amorphous semiconductor (e.g. amorphous silicon), a micro-crystalline semiconductor (e.g. micro-crystalline silicon), or a polycrystalline semiconductor (e.g. polycrystalline silicon) having a first conductive dopant. The first conductive dopant may be included in a semiconductor layer when the semiconductor layer is formed for forming the first conductive region 20 or may be included in the semiconductor layer using various doping methods, such as thermal diffusion, ion injection, and laser doping, after the semiconductor layer is formed.

Similarly, a second tunneling layer 54 may be formed on the back surface of the semiconductor substrate 110, and the second conductive region 30 may be positioned on the second tunneling layer 54. The material and thickness of the second tunneling layer 54 are similar to those of the first tunneling layer 52, and therefore a detailed description thereof will be omitted. The material and crystalline structure of the second conductive region are identical to or similar to those of the first conductive region 20 except that the second conductive region 30 has a first conductive dopant, and therefore a detailed description thereof will be omitted.

In this embodiment of the present invention, a first transparent conduction layer 421 may be formed between a first electrode 42 and the first conductive region 20, and a second transparent conduction layer 441 may be formed between a second electrode 44 and the second conductive region 30.

In an instance in which the tunneling layers 52 and 54 are formed on the front surface of the semiconductor substrate 110, and then the conductive regions 20 and 30 are formed on the tunneling layers 52 and 54 as described above, it is possible to greatly improve the passivation characteristics of the semiconductor substrate 110. In addition, it is possible to reduce the thickness of the semiconductor substrate 110, which is expensive, thereby reducing manufacturing cost. Furthermore, it is possible to manufacture the solar cell 100 at a low process temperature. Since the crystallinity of the conductive regions 20 and 30 is relatively low, however, carrier mobility may be relatively low. In this embodiment of the present invention, therefore, the first transparent conduction layer 421 is formed between the first electrode 42 and the first conductive region 20, and the second transparent conduction layer 441 is formed between the second electrode 44 and the second conductive region 30, thereby reducing resistance when the carriers move in a horizontal direction.

The first transparent conduction layer 421 may be formed throughout the first conductive region 20, which may mean that not only the first transparent conduction layer 421 may cover the entirety of the first conductive region 20 without an empty space or an empty region but also the first transparent conduction layer 421 may not be formed at a portion of the first conductive region 20. In an instance in which the first transparent conduction layer 421 is formed throughout the first conductive region 20, the carriers may easily reach the first electrode 42 via the first transparent conduction layer 421, thereby reducing resistance in the horizontal direction.

Since the first transparent conduction layer 421 is formed throughout the first conductive region 20, the first transparent conduction layer 421 may be formed of a light transmissive material. That is, the first transparent conduction layer 421 may be formed of a transparent conductive material for easily moving the carriers while transmitting light. Consequently, transmission of light is not blocked even in an instance in which the first transparent conduction layer 421 is formed throughout the first conductive region 20. For example, the first transparent conduction layer 421 may include an indium tin oxide (ITO) or a carbon nano tube (CNT). However, the embodiments of the present invention are not limited thereto. The first transparent conduction layer 421 may include various other materials.

The material and shape of the second transparent conduction layer 441 may be similar to those of the first transparent conduction layer 421, and therefore a detailed description thereof will be omitted.

On the first transparent conduction layer 421 may be positioned an anti-reflection film 24 having an opening 102, via which the first electrode 42 is connected to the first transparent conduction layer 421. The anti-reflection film 24 may include a dielectric material having a lower refractive index than the first transparent conduction layer 421. In an instance in which the anti-reflection film 24 having a lower refractive index than the first transparent conduction layer 421 is formed on the first transparent conduction layer 421 as described above, the first transparent conduction layer 421 and the anti-reflection film 24 may function as a double anti-reflection film. In addition, in an instance in which the anti-reflection film 24 includes a dielectric material, the anti-reflection film 24 may be used as a mask layer when the first electrode 42 is formed so as to have a pattern. In addition, the anti-reflection film 24 may also function as a protective layer for protecting the first transparent conduction layer 421.

In this embodiment of the present invention, the anti-reflection film 24 includes hydrogen. In this case, the anti-reflection film 24 may function as a hydrogen source at the post-processing operation (ST50). The material of the anti-reflection film 24 may be identical to or similar to that of the first passivation film 22 or the anti-reflection film 24 previously described with reference to FIG. 1, and the hydrogen content of the anti-reflection film 24 may be equal to or similar to that of the first passivation film 22 previously described with reference to FIG. 1.

In the above description and the figures, the anti-reflection film 24 positioned on the front surface of the semiconductor substrate 110 is illustrated as including hydrogen. However, the embodiments of the present invention are not limited thereto. For example, a dielectric film (e.g. the second passivation film 32 shown in FIG. 1 or an additional anti-reflection film) may be further positioned on the back surface of the semiconductor substrate 110, and the dielectric film positioned on the back surface of the semiconductor substrate 110 may include hydrogen.

The semiconductor substrate 110 including the base region 10 may be of a p-type having boron. In this case, it is possible to greatly improve the characteristics of the solar cell 100 due to the effects obtained by the post-processing operation (ST50). However, the embodiments of the present invention are not limited thereto. For example, the semiconductor substrate 110 may have a different dopant, or may be of an n-type. Even in this case, it is possible to achieve the effects obtained by the post-processing operation (ST50).

Hereinafter, the embodiment of the present invention will be described in more detail with reference to an experimental example. The experimental example is provided merely to describe the embodiments of the present invention in more detail and thus does not restrict the embodiments of the present invention.

Experimental Example

A solar cell having a structure as shown in FIG. 1 was manufactured using a semiconductor substrate including a p-type base region having boron. At this time, a passivation film included about $10^{20}$ ea/cm$^3$ of hydrogen, and a peak temperature was 700° C. and process time was 10 sec at an electrode firing operation. At the electrode firing operation, a hydrogen diffusion process was simultaneously carried out.

Subsequently, a preliminary heat treatment process was carried out at a temperature of about 200° C. for 5 minutes. A main processing process was carried out for a plurality of solar cells while changing the temperature, the light intensity, and the time, within a temperature range of 200 to 700° C. and a light intensity range of $10^4$ mW/cm$^2$ to $8\times10^4$ mW/cm$^2$ to measure an output loss of each solar cell. Based on the measured output loss values of the solar cells, temperature and light intensity exhibiting the same output losses were mapped as shown in FIG. 10, and light intensity and time exhibiting the same output losses were mapped as shown in FIG. 11.

Figure 10:
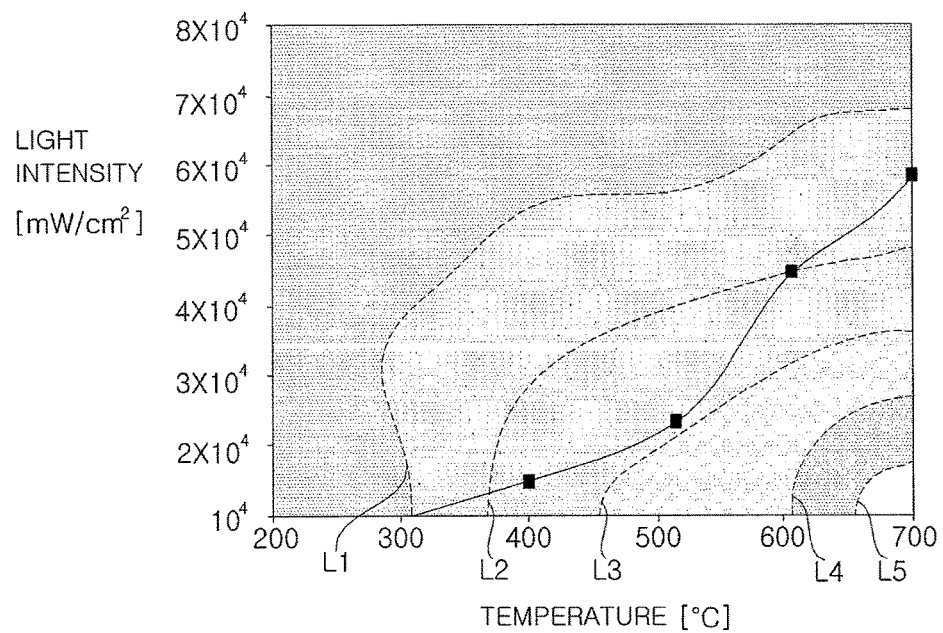
FIG. 10 is a graph showing temperature and light intensity lines exhibiting the same output losses in an experimental example of the present invention.

In FIG. 10, dotted lines L1, L2, L3, L4, and L5 interconnecting points indicating the same output losses are shown. The output loss is reduced in order of L5, L4, L3, L2, and L1. In addition, the minimum values $I_{min}$ of the light intensity calculated according to Equation 1 at temperatures of 300° C., 400° C., 500° C., 600° C., and 700° C. are shown as quadrangular points, and a line interconnecting the quadrangular points is shown as a solid line. In FIG. 11, dotted lines L11, L12, L13 interconnecting points indicating the same output losses are shown. The output loss is reduced in order of L13, L12, and L11.

Referring to FIG. 10, it can be seen that it is possible to reduce the output loss of the solar cell only when light having a predetermined light intensity or more is supplied at a uniform temperature and that it is necessary to also increase the light intensity as the temperature increases in order to reduce the output loss of the solar cell. It can also be seen that in an instance in which the light intensity is greater than that shown as the quadrangular point at each temperature, the output loss is reduced. Consequently, it can be seen that in an instance in which the main processing process is carried out at the temperature and the light intensity according to equations defined by the embodiments of the present invention, it is possible to actually reduce the output loss of the solar cell.

Figure 11:
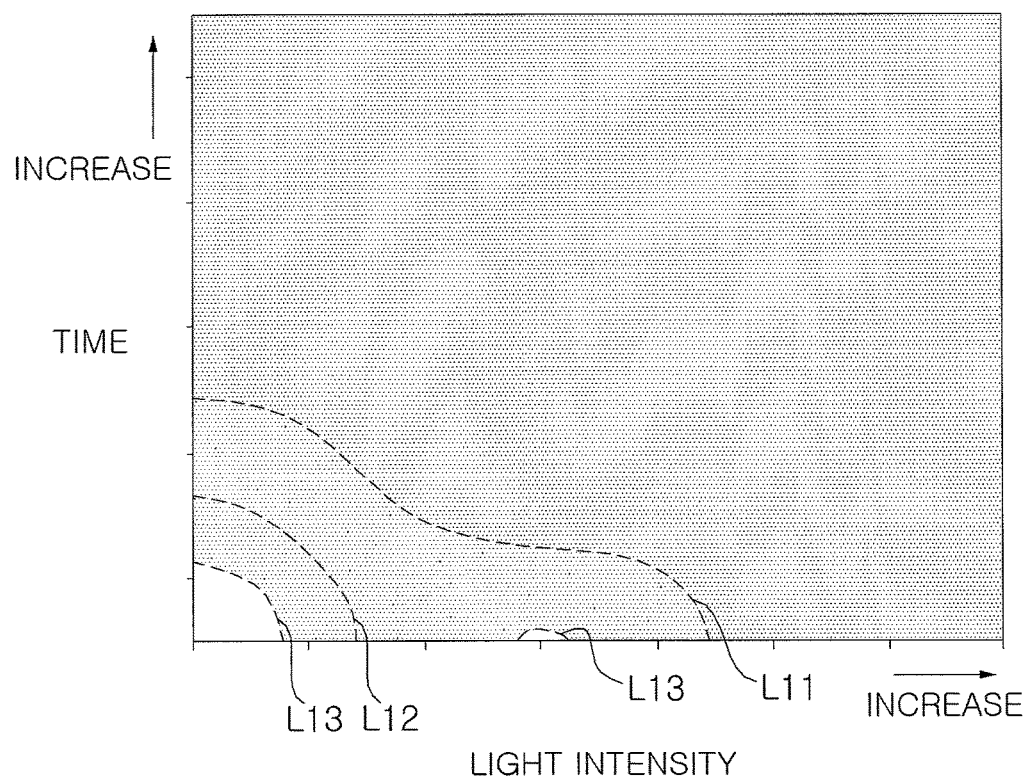
FIG. 11 is a graph showing light intensity and process time lines exhibiting the same output losses in an experimental example of the present invention.

Referring to FIG. 11, it can be seen that in an instance in which the light intensity is high, it is possible to greatly reduce the output loss even when the main processing process is carried out during a short process time. This coincides with the time-light intensity equations defined in the embodiments of the present invention.

At least the main processing process (ST56) (see FIG. 3) of the post-processing operation (ST50) (see FIG. 3) of the manufacturing method of the solar cell 100 may be carried out by a post-processing apparatus 200 of a solar cell according to an embodiment of the present invention (hereinafter, simply referred to as a "post-processing apparatus"). Hereinafter, a post-processing apparatus 200 according to an embodiment of the present invention will be described in detail.

Figure 12:
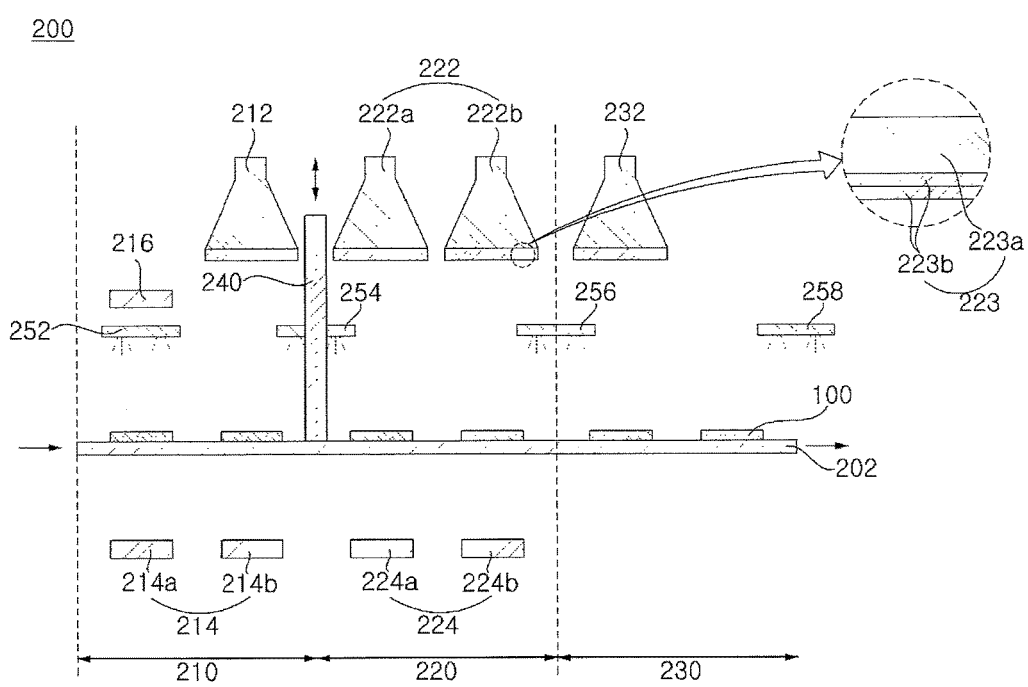
FIG. 12 is a view schematically showing the structure of a post-processing apparatus of a solar cell according to an embodiment of the present invention.

FIG. 12 is a view schematically showing the structure of a post-processing apparatus of a solar cell according to an embodiment of the present invention.

Referring to FIG. 12, the post-processing apparatus 200 of the solar cell according to this embodiment basically includes a main section 220, having a light source unit 222 and a first heat source unit 224, for carrying out the main period (ST562) (see FIG. 5) for the semiconductor substrate 110 (see FIG. 1) or the solar cell 100 including the semiconductor substrate 110. A temperature rising section 210 for carrying out the temperature rising period (ST561) (see FIG. 5) may be positioned before the main section 220, and a cooling section 230 for carrying out the cooling period (ST563) (see FIG. 5) may be positioned after the main section 220.

In this embodiment of the present invention, the temperature rising section 210, the main section 220, and the cooling section 230 are sequentially arranged. In a state in which the solar cell 100 is placed on a conveying unit, such as a conveyer belt 202, the conveyer belt 202 may move such that the solar cell 100 placed on the conveyer belt 202 sequentially passes through the temperature rising section 210, the main section 220, and the cooling section 230. Consequently, the process of the temperature rising period (ST561) is carried out for the solar cell 100 in the temperature rising section 210. Subsequently, the process of the main period (ST562) is carried out for the solar cell 100 in the main section 220. Subsequently, the process of the cooling period (ST563) is carried out for the solar cell 100 in the cooling section 230.

The conveyer belt 202 may have various structures and mechanisms in which the solar cell 100 can be stably placed on the conveyer belt 202. For example, the conveyer belt 202 may have a mesh structure in which light and heat can be more effectively provided to the solar cell 100, and the solar cell 100 can be maintained at a uniform temperature. In an example, a worktable 204 shown in FIG. 14 may extend to constitute the conveyer belt 202. The shape of the worktable 204 will hereinafter be described in more detail with reference to FIG. 14. However, the embodiments of the present invention are not limited thereto. The conveyer belt 202 may have various structures.

For example, the conveyer belt 202 may have a moving speed of 50 mm/min to 1000 mm/min. At this moving speed, the solar cell 100 can be moved without impact or damage to the solar cell 100, and the process of the temperature rising period, the process of the main period (ST562), and the process of the cooling period (ST563) can be carried out for the solar cell 100 during desired time.

However, the embodiments of the present invention are not limited thereto. The moving speed of the conveyer belt 202 may be variously changed. For example, in an instance in which an additional heat source unit 216 is positioned in the temperature rising section 210 to accelerate the increase of temperature, the moving speed of the conveyer belt 202 may be increased. Alternatively, in an instance in which the size of the temperature rising section 210, the main section 220, or the cooling section 230 is large and thus the process can be carried out during a sufficient time even when the moving speed of the conveyer belt 202 is high, the moving speed of the conveyer belt 202 may be increased. On the other hand, in an instance in which the size of the temperature rising section 210, the main section 220, or the cooling section 230 is small, the moving speed of the conveyer belt 202 may be decreased such that the process can be carried out during a sufficient time. In addition, the moving speeds of the conveyer belt 202 in the temperature rising section 210, the main section 220, and the cooling section 230 may be different from each other. Various other modifications are also possible.

In an instance in which the process is carried out in the temperature rising section 210, the main section 220, and the cooling section 230 based on an in-line process using the conveyer belt 202 as described above, it is possible to increase output due to the continuous process. In this embodiment of the present invention, the conveyer belt 202 is used as an example of the conveying means for the in-line process. However, the embodiments of the present invention are not limited thereto. Various structures and mechanisms that are capable of carrying out the in-line process may be used.

As described above, in this embodiment of the present invention, the in-line process using the conveyer belt is carried out. However, the embodiments of the present invention are not limited thereto. For example, the post-processing apparatus 200 may have a batch structure in which the process can be carried out in a state in which the solar cell 100 is not moved, i.e. the solar cell 100 is fixed at a specific position, which will be described in detail with reference to FIGS. 13 to 16.

Hereinafter, the main section 220 in which the basic process, i.e. the main period (ST562), of the main processing process (ST56) is carried out will be described in detail, and then the temperature rising section 210 and the cooling section 230 will be described in detail.

As previously described, in the main period (ST562), the solar cell 100 (or the semiconductor substrate 110) is heat-treated at a uniform temperature in a state in which light having a uniform light intensity is supplied to the solar cell 100. To this end, the main section 220 includes a light source unit 222 for supplying a light having a uniform light intensity to the solar cell 100 and a heat source unit (or a first heat source unit) 224 for heating the solar cell 100 at a uniform temperature.

The light source unit 222 functions to supply light having a uniform light intensity to the solar cell 100. As previously described, light having a light intensity of $1.7 \times 10^2$ mW/cm$^2$ to $10^5$ mW/cm$^2$ is needed in the main period (ST562). Consequently, the light source unit 222 may supply light having a light intensity of $1.7 \times 10^2$ mW/cm$^2$ to $10^5$ mW/cm$^2$.

At this time, various methods of adjusting the light intensity of the light source unit 222 may be used to supply light having light intensity necessary for the main period (ST562). That is, it is possible to adjust the number, kind, and output of light sources 222a and 222b constituting the light source unit 222 or to change the distance between the light sources 222a and 222b and the solar cell 100.

In this embodiment of the present invention, the light source unit 222, including the light sources 222a and 222b, may supply a sufficient amount of light to the solar cell 100. However, the embodiments of the present invention are not limited thereto. In an instance in which light having a high light intensity is not needed, only one of the light sources 222a and 222b may be provided.

Furthermore, in this embodiment of the present invention, each of the light sources 222a and 222b may be constituted by a plasma lighting system (PLS) for supplying light based on plasma emission. In the plasma lighting system, a bulb is filled with a specific gas, an electromagnetic wave, such as a microwave generated by a magnetron, or an incident beam is applied to the bulb to ionize the gas in the bulb (i.e. to generate plasma), and light is emitted from the plasma.

The plasma lighting system does not use an electrode, a filament, and mercury, which are components of a conventional lighting system. Consequently, the plasma lighting system is environmentally friendly and exhibits a semi-permanent lifetime. In addition, the plasma lighting system has a very excellent luminous flux maintenance factor. For this reason, the change in quantity of light is small even when the plasma lighting system is used based on super luminous flux for a long time. Furthermore, the plasma lighting system exhibits high thermal resistance and thus high thermal stability. Consequently, the plasma lighting system may be used in a space in which the heat source unit 224 is positioned. In addition, the plasma lighting system may emit light having a sufficient light intensity. For reference, another light source, such as a light emitting diode, exhibits low thermal resistance with the result that it is difficult to use the light emitting diode together with the heat source unit 224, and the light emitting diode emits only light having low light intensity. In addition, the plasma lighting system may emit almost uniform continuous light over all wavelengths of visible light. Consequently, the plasma lighting system may supply light similar to solar light. In this embodiment of the present invention, a compound of indium (In) and bromine (Br) may be used as the gas filling the bulb of the plasma lighting system. In this case, the plasma lighting system may have a spectrum more similar to that of solar light than in an instance in which sulfur is used as the gas filling the bulb of the plasma lighting system. In an instance in which light having a spectrum similar to that of the solar light is supplied, it is possible to carry out the main processing process (ST56) under conditions similar to those of the solar light, thereby effectively preventing output loss, which may be caused due to the solar light, through the main processing process (ST56).

In this embodiment of the present invention, a cover substrate 223 positioned on the front surface (i.e. light emitting surface) of each of the light sources 222*a* and 222*b* may include a base substrate 223*a* and a plurality of layers 223*b*, positioned on the base substrate 223*a*, including materials having different refractive indices.

The base substrate 223*a* may be formed of a light transmissive material having a sufficient strength to protect the light sources 222*a* and 222*b*. For example, the base substrate 223*a* may be formed of glass.

The layers 223*b*, which are configured by stacking layers having different refractive indices, may block undesired light. For example, the layers 223*b* may be formed of oxide materials having different refractive indices. In this case, the layers 223*b* may block light having a wavelength of less than 600 nm (specifically, 400 nm to 600 nm) and greater than 1000 nm. Various materials and stack structures of the layers 223*b* may be applied so long as the layers 223*b* can block light having a wavelength of less than 600 nm (specifically, 400 nm to 600 nm) and greater than 1000 nm.

In the figure, the layers 223*b* are illustrated as being positioned at the outer surface of the base substrate 223*a*. However, the embodiments of the present invention are not limited thereto. For example, the layers 223*b* may be positioned at the inner surface of the base substrate 223*a*. Alternatively, the layers 223*b* may be positioned at both the inner surface and the outer surface of the base substrate 223*a*.

In this embodiment of the present invention, the outer surface of the cover substrate 223 (i.e. the surface of the cover substrate 223 opposite to the solar cell 100) may be flat. As a result, light may be uniformly supplied to the solar cell 100 through the cover substrate 223 such that the light can be uniformly distributed over the solar cell 100. On the other hand, a light source of a general plasma lighting system is used outside. For this reason, a concave cover substrate is generally used to improve straightness of light.

Consequently, the light emitted from the light sources 222*a* and 222*b* to the solar cell 100 may have a wavelength of 600 nm to 1000 nm. In an instance in which an ultraviolet light portion of the light emitted from the light sources 222*a* and 222*b* is blocked as described above, it is possible to minimize lowering in passivation characteristics of the passivation film 22 (see FIG. 1) and/or 32 (see FIG. 8) which may be caused when ultraviolet light is emitted to the solar cell 100. In addition, in an instance in which an infrared light portion of the light emitted from the light sources 222*a* and 222*b* is blocked, it is possible to minimize an amount of heat supplied from the light sources 222*a* and 222*b* to the solar cell 100. On the other hand, in an instance in which the light sources 222*a* and 222*b* emit infrared light to the solar cell 100, the light source unit 222 as well as the heat source unit 224 may supply heat to the solar cell 100 with the result that it may be difficult to maintain the solar cell 100 at a desired temperature. In this embodiment of the present invention, therefore, it is possible to maximally prevent the light source unit 222 from affecting the temperature of the solar cell 100 such that the temperature of the solar cell 100 can be independently controlled by the heat source unit 224.

In this embodiment of the present invention, the cover substrate 223 constituting each of the light sources 222*a* and 222*b* may block a portion of the light such that only an efficient portion of the light for the main period (ST562) can be supplied to the solar cell 100. Consequently, it is possible to maximize the effects of the main period (ST562) through such a simple structure. However, the embodiments of the present invention are not limited thereto. For example, a filter may be disposed between the light sources 222*a* and 222*b* and the solar cell 100 for blocking a portion of the light.

In this embodiment of the present invention, the light sources 222*a* and 222*b*, each of which includes the plasma lighting system, are used. Consequently, it is possible to stably supply light having a desired light intensity to the solar cell 100. However, the embodiments of the present invention are not limited thereto. For example, one of the light sources 222*a* and 222*b* in the main section 220 may be constituted by the plasma lighting system, and the other of the light sources 222*a* and 222*b* may be constituted by another type of light source. Various other modifications are also possible.

In the main section 220, the heat source unit 224 may supply an appropriate amount of heat to the solar cell 100 such that the solar cell 100 has a desired temperature. Various mechanisms, structures, and shapes of the heat source unit 224 may be applied.

In this embodiment of the present invention, the heat source unit 224, including a plurality of heat sources 224*a* and 224*b*, may supply a sufficient amount of heat to the solar cell 100. However, the embodiments of the present invention are not limited thereto. Only one of the heat sources 224*a* and 224*b* may be provided in consideration of the structure, mechanism, and shape of the heat sources 224*a* and 224*b* and heat treatment temperature of the solar cell 100.

For example, each of the heat sources 224*a* and 224*b* constituting the heat source unit 224 may be an ultraviolet lamp. In an example, each of the heat sources 224*a* and 224*b* may be a halogen lamp. In another example, a coil heater may be used as each of the heat sources 224*a* and 224*b*. In an instance in which an ultraviolet lamp, such as a halogen lamp, is used as each of the heat sources 224*a* and 224*b*, it is possible to more rapidly increase the temperature of the solar cell 100 than in an instance in which the coil heater is used. On the other hand, in an instance in which a coil heater is used as each of the heat sources 224*a* and 224*b*, it is possible to reduce facility costs.

In this embodiment of the present invention, the heat source unit 224 may be spaced apart from the solar cell 100 or the conveyor belt 202, on which the solar cell 100 is placed, such that the heat source unit 224 can heat the solar cell 100 in an atmospheric heating fashion in which the heat source unit 224 heats air in the main section 220 by radiation. As a result, it is possible to minimize damage to the solar cell 100 caused by the heat source unit 224 and generation of heat from a local part of the solar cell 100. For example, in an instance in which each of the heat sources 224*a* and 224*b* of the heat source unit 224 is an ultraviolet lamp, the passivation characteristics of the passivation films 22 and 32 may be lowered by ultraviolet light emitted from the heat sources 224*a* and 224*b*. In addition, in a case in which the heat sources 224*a* and 224*b* of the heat source unit 224 directly contact each other, the heat sources 224*a* and 224b may locally heat the solar cell 100 due to a process error with the result that a portion of the solar cell 100 may be heated to an undesired temperature.

However, the embodiments of the present invention are not limited thereto. For example, the solar cell 100 may be heated by conduction instead of atmospheric heating, which will hereinafter be described in detail with reference to FIG. 13.

As described above, in the main period (ST562), the solar cell 100 is heat-treated in a state in which light is supplied from the light source unit 222 and heat is supplied from the heat source unit 224 such that the solar cell 100 is maintained at a uniform temperature. In this embodiment of the present invention, the light source unit 222 and the heat source unit 224 may supply light and heat to the solar cell 100 in a state in which the light source unit 222 and the heat source unit 224 are separated from each other. That is, the light sources 222a and 222b constituting the light source unit 222 are adjacent to each other, and the heat sources 224a and 224b constituting the heat source unit 224 are adjacent to each other such that the light sources 222a and 222b constituting the light source unit 222 and the heat sources 224a and 224b constituting the heat source unit 224 are spaced apart from each other. In this state, the light source unit 222 and the heat source unit 224 may supply light and heat to the solar cell 100, thereby minimizing the light source unit 222 and the heat source unit 224 from affecting each other.

For example, in the main section 220, the light source unit 222 may be positioned at one side of the solar cell 100, and the heat source unit 224 may be positioned at the other side of the solar cell 100 (for example, at the other side of the solar cell 100 opposite to the one side of the solar cell 100). As a result, light and heat from the light source unit 222 and the heat source unit 224 may be effectively supplied to the solar cell 100 in a state in which interference between the light source unit 222 and the heat source unit 224 is minimized.

In an example, the light source unit 222 may be positioned at the upper side of the solar cell 100 (i.e. the upper side of the conveyor belt 202), and the heat source unit 224 may be positioned at the lower side of the solar cell 100 (i.e. the lower side of the conveyor belt 202). In an instance in which the light source unit 222 is positioned at the lower side of the conveyor belt 202, a portion of light emitted from the light source unit 222 is blocked by the conveyor belt 202 with the result that the light may not be effectively supplied to the solar cell 100. On the other hand, in an instance in which the heat source unit 224 is positioned at the lower side of the conveyor belt 202, it is possible to supply a sufficient amount of heat to the solar cell 100 by atmospheric heating. In this embodiment of the present invention, therefore, the light source unit 222 is positioned at the upper side of the solar cell 100 or the conveyor belt 202, and the heat source unit 224 is positioned at the lower side of the solar cell 100 or the conveyor belt 202). However, the embodiments of the present invention are not limited thereto. Positions of the light source unit 222 and the heat source unit 224 may be changed.

The temperature rising section 210, which is positioned before the main section 220, is a section for carrying out the temperature rising period (ST561) of the main processing process (ST56). That is, the temperature rising section 210 is a section for preliminarily heating the solar cell 100 at a temperature necessary for the main period (ST562) of the main processing process (ST56). To this end, the temperature rising section 210 includes a heat source unit (or a second heat source unit) 214 for supplying heat to the solar cell 100.

The heat source unit 214 of the temperature rising section 210 may be positioned at the same side (e.g. the lower side) as the heat source unit 224 of the main section 220. In an instance in which the heat source unit 214 of the temperature rising section 210 and the heat source unit 224 of the main section 220 are positioned at one side as described above, the structure of the post-processing apparatus 200 may be simplified. However, the embodiments of the present invention are not limited thereto. The heat source unit 214 of the temperature rising section 210 and the heat source unit 224 of the main section 220 may be variously modified.

In the temperature rising section 210, the heat source unit 214 may supply an appropriate amount of heat to the solar cell 100 such that the solar cell 100 can be preliminarily heated to a desired temperature. Various mechanisms, structures, and shapes of the heat source unit 214 may be applied.

In this embodiment of the present invention, the heat source unit 214, including a plurality of heat sources 214a and 214b, may supply a sufficient amount of heat to the solar cell 100. However, the embodiments of the present invention are not limited thereto. Only one of the heat sources 214a and 214b may be provided in consideration of the structure, mechanism, and shape of the heat sources 214a and 214b and heat treatment temperature of the solar cell 100.

For example, each of the heat sources 214a and 214b constituting the heat source unit 214 may be an ultraviolet lamp. In an example, each of the heat sources 214a and 214b may be a halogen lamp. In another example, a coil heater may be used as each of the heat sources 214a and 214b. In an instance in which an ultraviolet lamp, such as a halogen lamp, is used as each of the heat sources 214a and 214b, it is possible to more rapidly increase the temperature of the solar cell 100 than in an instance in which a coil heater is used. On the other hand, in an instance in which a coil heater is used as each of the heat sources 214a and 214b, it is possible to reduce facility costs.

In this embodiment of the present invention, the heat source unit 214 may be spaced apart from the solar cell 100 or the conveyor belt 202, on which the solar cell 100 is placed, such that the heat source unit 214 can heat the solar cell 100 in an atmospheric heating fashion in which the heat source unit 214 heats air in the temperature rising section 210 by radiation. As a result, it is possible to minimize damage to the solar cell 100 caused by the heat source unit 214 and generation of heat from a local part of the solar cell 100.

The temperature rising section 210 may further include an additional heat source unit 216 positioned at the side opposite to the heat source unit 214 (e.g. the upper side of the solar cell 100 or the conveyor belt 202). In an instance in which the heat source unit 214 and the additional heat source unit 216 supply heat to the solar cell 100 at the opposite sides of the solar cell 100 in the temperature rising section 210 as described above, it is possible to increase the temperature rising speed of the solar cell 100. The additional heat source unit 216 may be adjacent to the entrance of the temperature rising section 210, through which the solar cell 100 is introduced into the temperature rising section 210. As a result, the temperature rising speed of the solar cell 100 in the temperature rising section 210 may be increased, thereby improving productivity.

Various mechanisms, structures, and shapes of the additional heat source unit 216 may be applied. In this embodiment of the present invention, the additional heat source unit 216 includes one heat source. However, the embodiments of the present invention are not limited thereto. The additional heat source unit 216 may include a plurality of heat sources in consideration of the structure, mechanism, and shape of the additional heat source unit 216 and heat treatment temperature of the solar cell 100.

In addition, an additional light source (or a first additional light source) 212 may be also positioned in the temperature rising section 210. When it is necessary to supply a larger amount of light in the main period (ST562) carried out in the main section 220 or when it is necessary to increase the process time of the main period (ST562), the additional light source 212 of the temperature rising section 210 may be provided to carry out the same process as that of the main period (ST562) in the temperature rising section 210. That is, a portion of the temperature rising section 210 may be used as the main section 220 as needed, which will hereinafter be described in more detail when describing a partition wall unit 240.

The additional light source 212 may be positioned in the temperature rising section 210 in a state in which the additional light source 212 is adjacent to the main section 220 such that a portion of the temperature rising section 210 can be easily used as the main section 220. Referring to FIG. 5, a portion of the temperature rising period (ST561) adjacent to the main period (ST562) has a temperature equal to or similar to that of the main period (ST562). Consequently, a portion of the temperature rising section 210 may be used as the main section 220.

Various mechanisms, structures, and shapes of the additional light source 212 may be applied. For example, the additional light source 212 may be constituted by the same plasma lighting system as each of the light sources 222a and 222b of the light source unit 222 and may have a structure identical to or similar to that of each of the light sources 222a and 222b of the light source unit 222. In this embodiment of the present invention, one additional light source 212 is provided. However, the embodiments of the present invention are not limited thereto. A plurality of additional light sources 212 may be provided in consideration of the structure, mechanism, and shape of each of the additional light sources 212 and required intensity of light.

However, the additional light source 212 is not a requisite. Since light is not fundamentally supplied to the solar cell 100 in the temperature rising period (ST561) carried out in the temperature rising section 210, therefore, the temperature rising section 210 may carry out only the temperature rising period (ST561) without the provision of the additional light source 212.

Between the temperature rising section 210 and the main section 220 may be positioned a partition wall unit 240 for partitioning or defining the temperature rising section 210 and the main section 220. The partition wall unit 240 functions to prevent generation of undesired combination in the temperature rising period (ST561) which may be caused by light supplied from the main section 220 to the solar cell 100 positioned in the temperature rising section 210.

Various structures of the partition wall unit 240 may be applied. For example, the partition wall unit 240 may be a structure (e.g. a metal plate or a dielectric plate) for physically partitioning the temperature rising section 210 and the main section 220. The partition wall unit 240 may be installed such that the partition wall unit 240 can be moved upward and downward. When it is necessary to supply a larger amount of light in the main period (ST562) carried out in the main section 220 or when it is necessary to increase the process time of the main period (ST562), therefore, the partition wall unit 240 may be moved upward such that the additional light source 212 of the temperature rising section 210 can carry out the same process as that of the main period (ST562) in the temperature rising section 210. When it is not necessary to use the additional light source 212, the partition wall unit 240 may be moved downward to prevent introduction of light from the main section 220 to the temperature rising section 210.

The cooling section 230, which is positioned after the main section 220, is a section for carrying out the cooling period (ST563) of the main processing process (ST56). That is, the cooling section 230 is a section for cooling the solar cell 100 having passed the main period (ST562) of the main processing process (ST56). For this reason, the cooling section 230 includes no heat source unit.

The solar cell 100 may be slowly cooled by air or more rapidly cooled using an additional cooling apparatus. However, the embodiments of the present invention are not limited thereto. Various structures for cooling may be applied.

An additional light source 232 may be also positioned in the cooling section 230. When it is necessary to supply a larger amount of light in the main period (ST562) carried out in the main section 220 or when it is necessary to increase the process time of the main period (ST562), the additional light source 232 of the cooling section 230 may be provided to carry out the same process as that of the main period (ST562) in the cooling section 230. That is, a portion of the cooling section 230 may be used as the main section 220 as needed. The additional light source 232 may be positioned in the cooling section 230 in a state in which the additional light source 232 is adjacent to the main section 220 such that a portion of the cooling section 230 can be easily used as the main section 220.

Various mechanisms, structures, and shapes of the additional light source 232 may be applied. For example, the additional light source 232 may be constituted by the same plasma lighting system as each of the light sources 222a and 222b of the light source unit 222 and may have a structure identical to or similar to that of each of the light sources 222a and 222b of the light source unit 222. In this embodiment of the present invention, one additional light source 232 is provided. However, the embodiments of the present invention are not limited thereto. A plurality of additional light sources 212 may be provided in consideration of the structure, mechanism, and shape of each of the additional light sources 212 and required intensity of light.

However, the additional light source 232 is not a requisite. Since it is not necessary to fundamentally supply heat to the solar cell 100 in the cooling period (ST563) carried out in the cooling section 230, therefore, the cooling section 230 may carry out only the cooling period (ST563) without the provision of the additional light source 232.

A partition wall unit may also be positioned between the main section 220 and the cooling section 230. This partition wall unit may have a structure identical to or similar to that of the partition wall unit positioned between the temperature rising section 210 and the main section 220. Since the solar cell 100 is little affected even when light is introduced into the cooling section 230, however, no partition wall unit may be positioned between the main section 220 and the cooling section 230. As a result, it is possible to simplify the structure of the post-processing apparatus 200.

In this embodiment of the present invention, air curtain members 252, 254, 256, and 258 may be installed at at least one of the interfaces defined among the temperature rising section 210, the main section 220, and the cooling section 230. For example, each of the air curtain members 252, 254, 256, and 258 may have a bar shape with a plurality of air injection holes, through which air is supplied. However, the embodiments of the present invention are not limited thereto. Various structures and mechanisms of the air curtain members 252, 254, 256, and 258 may be applied.

In this embodiment of the present invention, the first air curtain member 252 may be positioned at the entrance of the temperature rising section 210, the second air curtain member 254 may be positioned between the temperature rising section 210 and the main section 220, the third air curtain member 256 may be positioned between the main section 220 and the cooling section 230, and the fourth air curtain member 258 may be positioned at the exit of the cooling section 230. The second air curtain member 254 may be installed at the partition wall unit 240 positioned between the temperature rising section 210 and the main section 220. Alternatively, the second air curtain member 254 may be installed separately from the partition wall unit 240. In an instance in which a partition wall unit is provided between the main section 220 and the cooling section 230, the third air curtain member 256 may also be installed at the partition wall unit. Alternatively, the third air curtain member 256 may be installed separately from the partition wall unit. Various other modifications are also possible.

The first air curtain member 252 may be positioned at the entrance of the temperature rising section 210 for blocking external air to prevent heat loss of the post-processing apparatus 200. The second air curtain member 254 may partition the temperature rising section 210 and the main section 220 for preventing interference between the temperature rising section 210 and the main section 220 in terms of heat and light. The third air curtain member 256 may partition the main section 220 and the cooling section 230 for preventing interference between the main section 220 and the cooling section 230 in terms of heat and light. The fourth air curtain member 258 may be positioned at the exit of the cooling section 230 for blocking external air and assisting cooling of the solar cell 100.

As described above, in this embodiment of the present invention, the first to fourth air curtain members 252, 254, 256, and 258 are provided. However, the embodiments of the present invention are not limited thereto. For example, only one of the first to fourth air curtain members 252, 254, 256, and 258 may be provided. In addition, one or more additional air curtain members may be further provided at positions different from those of the first to fourth air curtain members 252, 254, 256, and 258.

Hereinafter, the operation of the post-processing apparatus 200 with the above-stated construction will be described in detail. A solar cell 100, which will pass through the main processing process (ST56) of the post-processing operation (S50), is placed on the conveyor belt 202, and then the conveyor belt 202 is sequentially moved through the temperature rising section 210, the main section 220, and the cooling section 230. In the temperature rising section 210, the solar cell 100 is preliminarily heated to a temperature necessary for the main period (ST562) by the heat source unit 214. In the main section 220, the light source unit 222 emits light to the solar cell 100, and the heat source unit 224 supplies heat to the solar cell 100 to passivate the surface of the semiconductor substrate 110 or the bulk of the semiconductor substrate 110 (e.g. $H^+$ is converted into $H^0$ or $H^-$ to generate the B—H combination). In the cooling section 230, the solar cell 100 is cooled.

In the main section 220, the light source unit 222 emits light having light intensity necessary for the main period (ST562), and the heat source unit 224 maintains the solar cell 100 at a temperature necessary for the main period (ST562). In addition, the moving speed of the conveyor belt 202 may be adjusted such that the solar cell 100 can stay in the main section 220 for a desired process time. As a result, the main processing process (ST56) may be carried out on the solar cell 100 based on heat treatment temperature, light intensity, and process time satisfying the conditions of Equations 1 to 15.

That is, in the post-processing apparatus 200 according to this embodiment of the present invention, the main processing process (ST56) of the post-processing operation (S50) for supplying both heat and light may be stably and efficiently carried out to post-process the semiconductor substrate 110 or the solar cell including the semiconductor substrate 110, temperature, light intensity, and process time necessary for the main processing process (ST56) of the post-processing operation (S50) may be maintained to maximize the effects of the main processing process (ST56).

The post-processing apparatus 200 may post-process the solar cell 100 in a stand-alone fashion in which the solar cell 100 is post-processed after the electrode forming operation (ST40) (see FIG. 3). Alternatively, the post-processing apparatus 200 may sequentially carry out a portion or the entirety of the electrode forming operation (ST40) (specifically, the firing operation (ST44) and/or the hydrogen diffusion process (ST52)) and the preliminary heat treatment process (ST54). Alternatively, the post-processing apparatus 200 may control operations of the light source unit 22 and the heat source units 214 and 224 such that a portion or the entirety of the electrode forming operation (ST40) (specifically, the firing operation (ST44) and/or the hydrogen diffusion process (ST52)) and the preliminary heat treatment process (ST54) are all carried out in the post-processing apparatus 200. Various other modifications are also possible.

In the above-described embodiment of the present invention, the in-line process using the conveyer belt 202 is carried out, and the atmospheric heating is used in the temperature rising section 210 and the main section 220. However, the embodiments of the present invention are not limited thereto. Hereinafter, a modification of the post-processing apparatus 200 will be described in detail with reference to FIG. 13.

Figure 13:
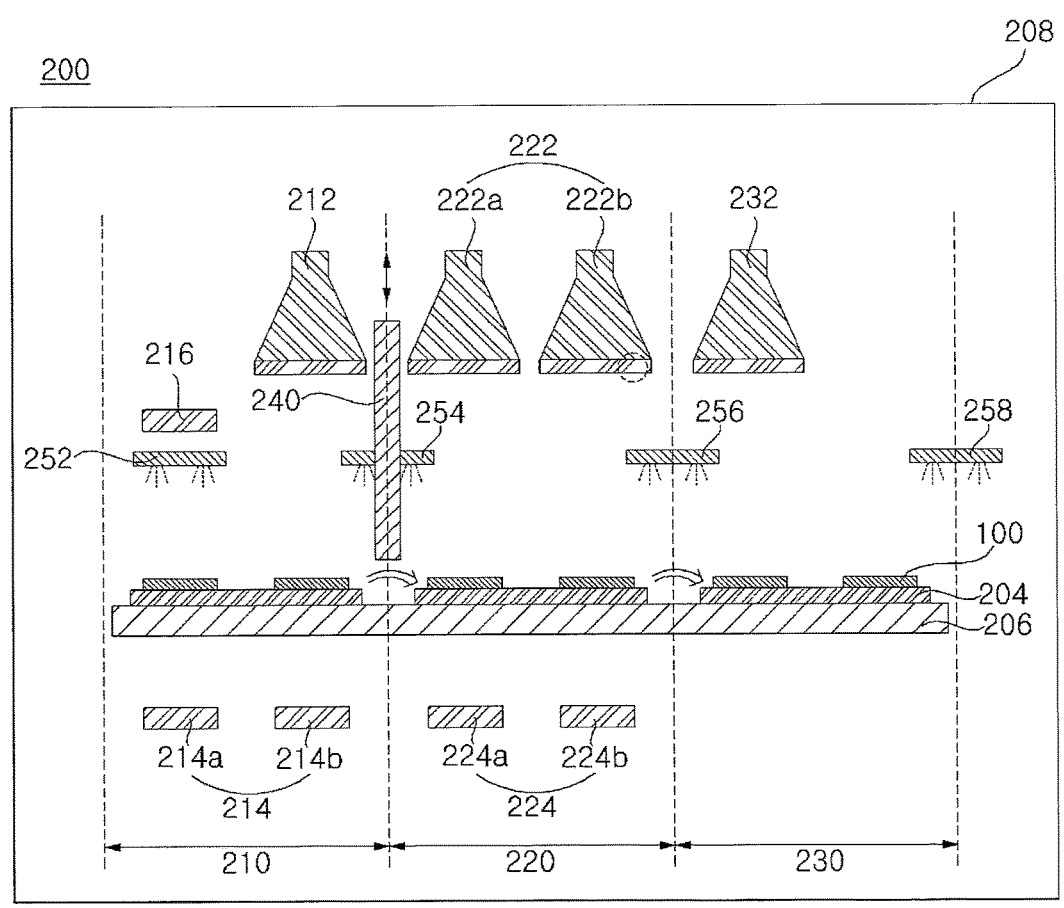
FIG. 13 is a view schematically showing the structure of a post-processing apparatus of a solar cell according to a modification of an embodiment of the present invention.
Figure 14:
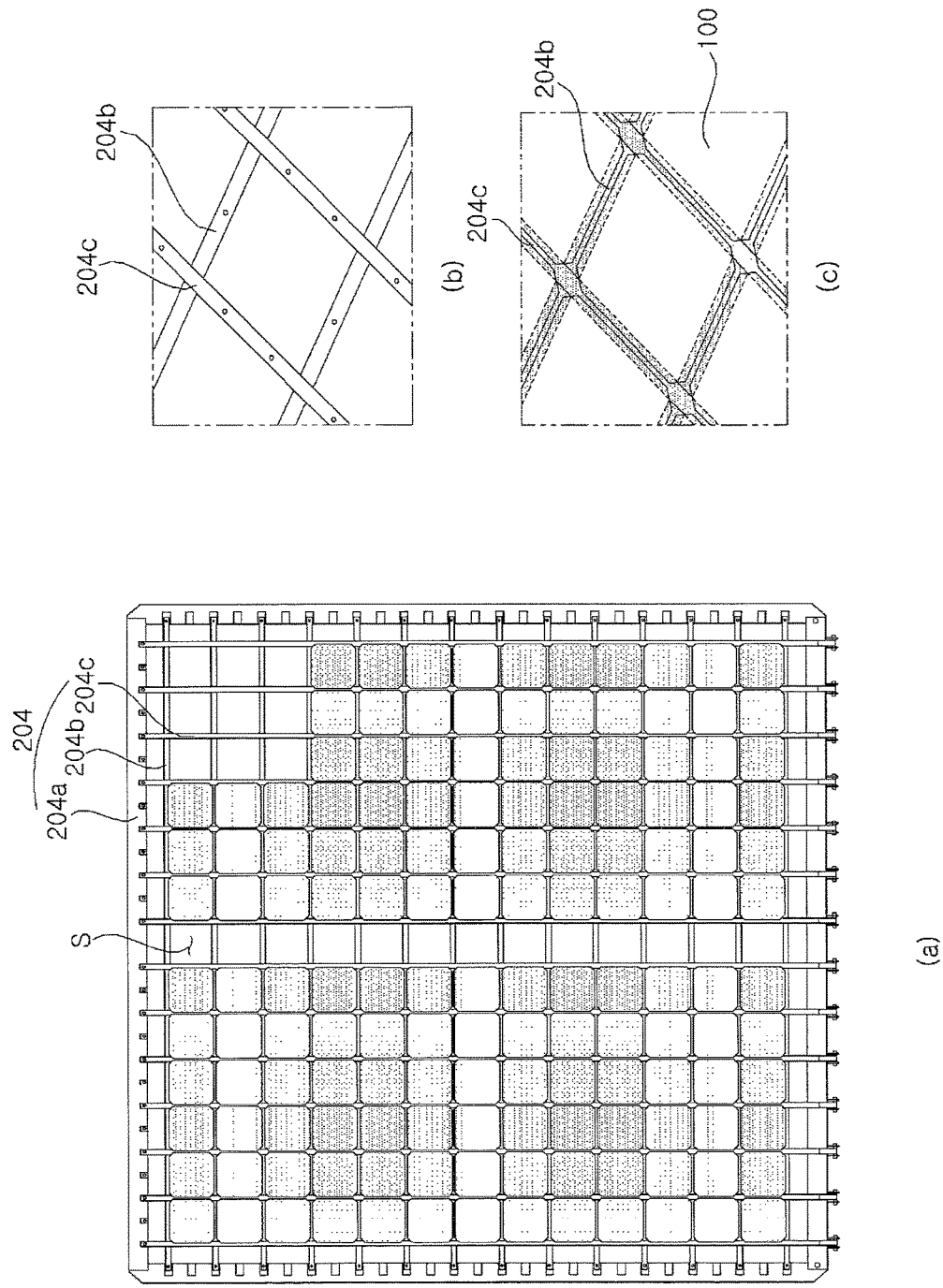
FIG. 14 is a view showing an example of a worktable applied to the post-processing apparatus of the solar cell shown in FIG. 13 according to an embodiment of the present invention.

FIG. 13 is a view schematically showing the structure of a post-processing apparatus of a solar cell according to a modification of the embodiments of the present invention. FIG. 14 is a view showing an example of a worktable applied to the post-processing apparatus of the solar cell shown in FIG. 13. (a) of FIG. 14 is a plan view schematically showing the worktable, (b) of FIG. 14 is a partial perspective view showing first and second parts, and (c) FIG. 14 is a partial perspective view showing a state in which solar cells are positioned on the first and second parts. Parts identical to or similar to those of the post-processing apparatus according to the previous embodiment of the present invention may be equally applied to the following embodiments of the present invention, and therefore a detailed description thereof will be omitted.

As shown in FIG. 13, in this modification, no conveyor belt is positioned in the temperature rising section 210, the main section 220, and the cooling section 230, and the process is carried out in a state in which the solar cell 100 is stationary. When the process is completed, the solar cell 100 may be moved by a worker or a transfer device, such as a working beam. That is, the solar cell 100 may be preliminarily heated in a state in which the solar cell 100 is positioned in the temperature rising section 210. When the preliminary heating process is completed, the solar cell 100 positioned in the temperature rising section 210 may be moved into the main section 220. When the process is completed in the main section 220, the solar cell 100 positioned in the main section 220 may be moved into the cooling section 230.

That is, in this embodiment of the present invention, the post-processing apparatus 200 has a batch structure in which the process is carried out in a state in which the solar cell 100 is stationary. In an instance in which the process is carried out in a state in which the solar cell 100 is stationary as described above, it is possible to easily adjust and maintain light intensity and thermal energy required for the temperature rising section 210, the main section 220, and the cooling section 230 and to easily adjust process time. In addition, interference with an external environment may be minimized during the process, thereby improving uniformity of the process. Furthermore, the conveyor belt may be omitted, thereby reducing facility costs.

In this embodiment of the present invention, the temperature rising section 210, the main section 220, and the cooling section 230 are all positioned in one chamber 208. In an instance in which the temperature rising section 210, the main section 220, and the cooling section 230 are all positioned in one chamber 208 as described above, an installation space for the temperature rising section 210, the main section 220, and the cooling section 230 may be minimized.

For example, a support table 206 for supporting the solar cell 100 may be positioned in the temperature rising section 210, the main section 220, and the cooling section 230. The support table 206 may have a material or structure which does not interrupt the supply of thermal energy from the heat source units 214 and 224 to the solar cell 100. However, the embodiments of the present invention are not limited thereto. Another structure for fixing the solar cell 100 may be provided instead of the support table 206.

Solar cells 100 may be individually placed on the support table 206 and individually moved. Alternatively, as shown in FIG. 14, a plurality of solar cells 100 may be placed on a worktable (tray) 204, and then the worktable 204 may be placed on the support table 206. In this case, it is possible to simultaneously move a large number of solar cells 100, thereby improving process efficiency.

In this embodiment of the present invention, the solar cells 100 may be placed on the worktable 204 in a state in which interference with the light source unit 222 positioned at the upper side of the worktable 204 and interference with the heat source units 214 and 224 positioned at the lower side of the worktable 204 are minimized.

For example, the worktable 204 may include a frame part 204a forming an outer edge of the worktable 204, a plurality of first parts 204b extending in one direction at uniform intervals, and a plurality of second parts 204c extending in a direction intersecting the first parts 204b at uniform intervals.

The first parts 204b and the second parts 204c intersect each other in the frame part 204a. As a result, the worktable 204 has a matrix or mesh structure. More specifically, a space S (e.g. a quadrangular space) is defined by two neighboring first parts 204b and two neighboring second parts 204c. The side of the space S is blocked by the first parts 204b and the second parts 204c. Consequently, the space S may be formed in the shape of a closed opening when viewed from above. In the figure, the first parts 204b and the second parts 204c are illustrated as each having a straight shape and being coupled to each other. However, the embodiments of the present invention are not limited thereto. For example, the first parts 204b and the second parts 204c may have a single structure including one layer. Various other modifications are also possible.

In this embodiment of the present invention, the edge of each solar cell 100 is placed on two neighboring first parts 204b and two neighboring second parts 204c. That is, the vertical width of each solar cell 100 may be less than the width of the two neighboring first parts 204b, and the horizontal width of each solar cell 100 may be less than the width of the two neighboring second parts 204c. Consequently, the area of the space S is less than that of each solar cell 100 with the result that the edge of each solar cell 100 is placed over the first and second parts 204b and 204c. That is, each solar cell 100 is placed over the space S defined by the two neighboring first parts 204b and the two neighboring second parts 204c while entirely covering the space S. As a result, thermal energy from the heat source units 214 and 224 positioned at the lower side of the worktable 204 may be effectively transferred to the solar cell 100 through the space S. On the other hand, light from the light source unit 222 at the upper side of the worktable 204 may be blocked by the worktable 204 and the solar cell 100 with the result that the heat source units 214 and 224 are prevented from being affected by the light from the light source unit 222. Consequently, it is possible to prevent lowering in temperature uniformity of the solar cell 100 due to interference between the light source unit 222 and the heat source units 214 and 224.

Figure 15:
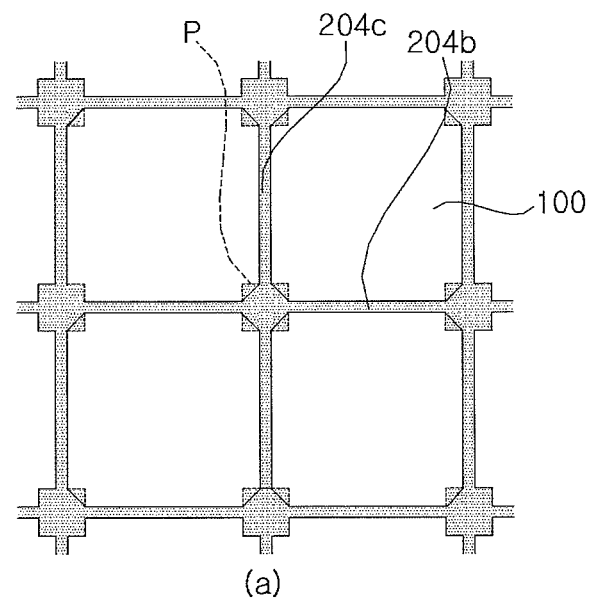
FIG. 15 is a partial plan view showing another example of the worktable applied to the post-processing apparatus of the solar cell shown in FIG. 13 according to an embodiment of the present invention.
Figure 15:
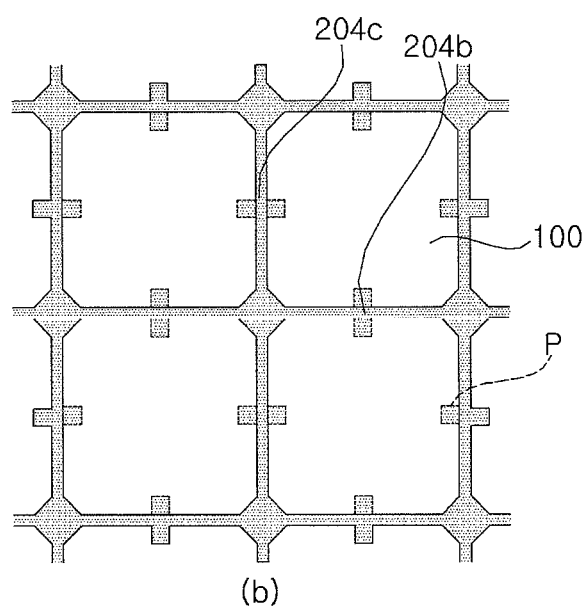

In the embodiment shown in FIG. 14, the edge of each solar cell 100 is placed over the first and second parts 204b and 204c. However, the embodiments of the present invention are not limited thereto. The worktable 204 may have various structures for fixing the solar cell 100. In another modification, as shown in FIG. 15, the vertical width of each solar cell 100 may be equal to the width of two neighboring first parts 204b, and the horizontal width of each solar cell 100 may be equal to the width of two neighboring second parts 204c. In addition, protrusions P may protrude inwardly from the first and second parts 204b and 204c for each space S such that each solar cell 100 is placed on the protrusions P. As a result, a major portion of the area of the solar cell 100 excluding portions corresponding to the protrusions P may be placed over the space C, thereby effectively achieving heat transfer. As shown in (a) of FIG. 15, the protrusions P may be provided at the first and second parts 204b and 204c on four corners of each space S. Alternatively, as shown in (b) of FIG. 15, the protrusions P may be provided at the first and second parts 204b and 204c on the middle parts of four sides of each space S. The position and number of the protrusions P may be variously changed.

Referring back to FIG. 14, a plurality of spaces S may be defined by the first parts 204b and the second parts 204c. Consequently, a corresponding number of solar cells 100 may be placed on the worktable 204. For example, 10 to 20 spaces S may be formed in one direction (e.g. a horizontal direction), and 10 to 20 spaces S may be formed in another direction (e.g. a vertical direction) intersecting the above-mentioned direction. As a result, 100 to 400 spaces S may be formed on each worktable 204. Consequently, 100 to 400 solar cells 100 may be simultaneously processed on one worktable 204, thereby simplifying the process and achieving mass production.

The strength of the work table 204 may be increased by the provision of the frame part 204a, thereby improving structural stability of the work table 204. For example, the width of the frame part 204a may be greater than that of the first and second parts 204b and 204c to further increase the strength of the work table 204. However, the embodiments of the present invention are not limited thereto. The width of the frame part 204a may be variously changed. In addition, the frame part 204a may be omitted to simplify the structure of the work table 204.

In this embodiment of the present invention, the material of the frame part 204a may be different from that of the first and second parts 204b and 204c. For example, the material of the frame part 204a may have a higher strength than that of the first and second parts 204b and 204c. In this case, the strength of the work table 204 may be increased. In addition, the material of the first and second parts 204b and 204c may have a higher thermal conductivity than that of the frame part 204a. In this case, transfer of heat from the heat source units 214 and 224 to the solar cell 100 may not be interrupted. For example, the frame part 204a may be made of stainless steel (SUS), and the first and second parts 204b and 204c may be made of aluminum. However, the embodiments of the present invention are not limited thereto. The frame part 204a and the first and second parts 204b and 204c may be made of various other materials.

Figure 16:
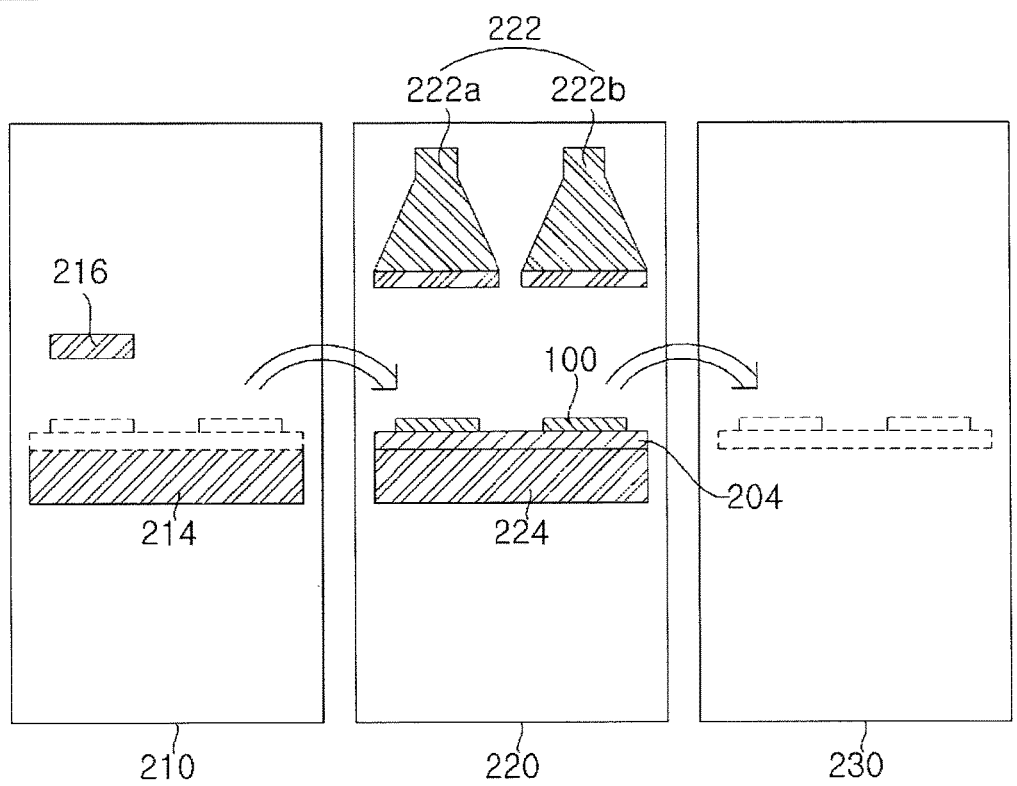
FIG. 16 is a view schematically showing the structure of a post-processing apparatus of a solar cell according to another modification of an embodiment of the present invention.

FIG. 16 is a view schematically showing the structure of a post-processing apparatus of a solar cell according to another modification of the embodiments of the present invention. Parts identical to or similar to those of the post-processing apparatus according to the previous embodiment of the embodiments of the present invention may be equally applied to the following embodiments of the present invention, and therefore a detailed description thereof will be omitted.

Referring to FIG. 16, in this embodiment of the present invention, the post-processing apparatus 200 has a batch structure in a state in which a temperature rising section 210, a main section 220, and a cooling section 230 have separate spaces. Consequently, it is possible to easily adjust and maintain light intensity and thermal energy required for the temperature rising section 210, the main section 220, and the cooling section 230 and to easily adjust process time. In addition, interference with an external environment may be minimized during the process, thereby improving uniformity of the process. Furthermore, no conveyor belt may be provided, thereby reducing facility costs.

However, the embodiments of the present invention are not limited thereto. For example, the temperature rising section 210 and the main section 220 may be continuously positioned such that the process can be carried out based on an in-line process, and the cooling section 230 may have a separate structure. In another example, the temperature rising section 210 may have a separate structure, and the main section 220 and the cooling section 230 may be continuously positioned such that the process can be carried out based on the in-line process. In another example, the temperature rising section 210 and the main section 220 may have a batch structure in a state in which the temperature rising section 210 and the main section 220 are positioned in one chamber, and the cooling section 230 may have a separate structure. In a further example, the temperature rising section 210 may have a separate structure, and the main section 220 and the cooling section 230 may have a batch structure in a state in which the main section 220 and the cooling section 230 are positioned in one chamber. Various other modifications are also possible.

In this embodiment of the present invention, a work table 204, on which a solar cell 100 is placed, may be preliminarily heated or heat-treated in a state in which the work table 204 is in contact with a heat source unit 214 of the temperature rising section 210 or a heat source unit 224 of the main section 220. As a result, heat from the work table 204 is transferred to the solar cell 100 by conduction.

In an instance in which the heat from the work table 204 is transferred to the solar cell 100 by conduction as described above, it is possible to heat the solar cell 100 within a short time. In addition, the process is carried out in a state in which the solar cell 100 is stationary in the temperature rising section 210 and the main section 220. Consequently, it is possible to easily adjust time during which light and heat are supplied to the solar cell 100 by adjusting time during which the solar cell 100 stays in the temperature rising section 210 or the main section 220. In addition, it is possible to carry out the process for a desired process time without increasing the size of the temperature rising section 210 and the main section 220.

In the figure, the temperature rising section 210 is illustrated as including an additional heat source unit 216 for carrying out atmospheric heating by radiation to improve heating efficiency. However, the embodiments of the present invention are not limited thereto. The additional heat source unit 216 may not be provided. Various other modifications are also possible.

However, the embodiments of the present invention are not limited thereto. For example, the work table 204, on which the solar cell 100 is placed, may be preliminarily heated or heat-treated in a state in which the work table 204 is spaced apart from the heat source unit 214 of the temperature rising section 210 or the heat source unit 224 of the main section 220. In this case, heat is transferred to the solar cell 100 by radiation. Consequently, it is possible to stably supply heat to the solar cell 100 while minimizing possible damage to the solar cell 100.

Figure 17:
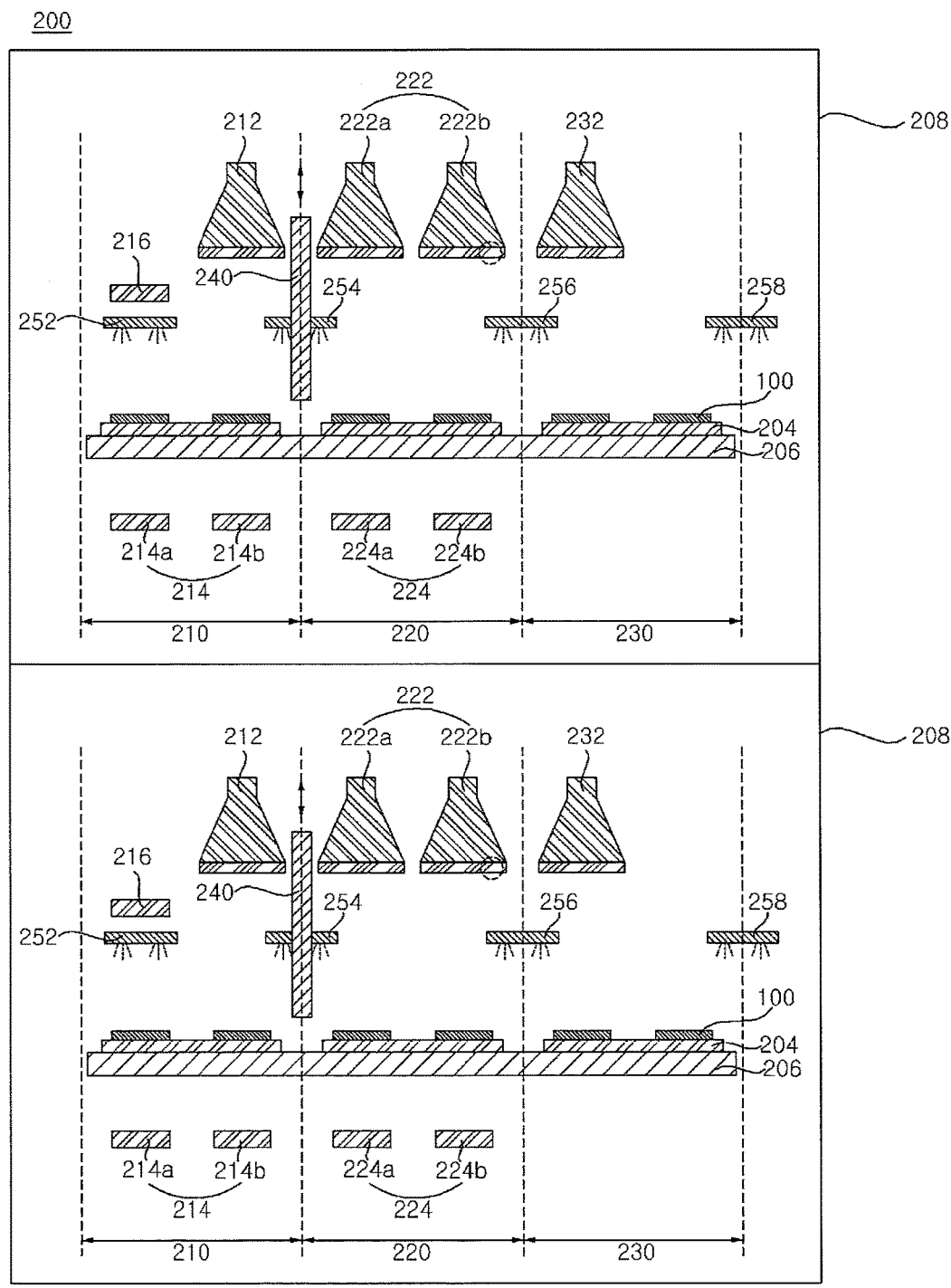
FIG. 17 is a view schematically showing the structure of a post-processing apparatus of a solar cell according to another modification of an embodiment of the present invention.

FIG. 17 is a view schematically showing the structure of a post-processing apparatus of a solar cell according to another modification of the embodiments of the present invention.

Referring to FIG. 17, in this embodiment of the present invention, the post-processing apparatus 200 may include a plurality of post-processing units, each of which includes a temperature rising section 210, a main section 220, and a cooling section 230. For example, one post-processing unit including a temperature rising section 210, a main section 220, and a cooling section 230 may be positioned above another post-processing unit including a temperature rising section 210, a main section 220, and a cooling section 230. That is, a plurality of post-processing units may be positioned in a vertical direction to have a multi-stage structure, thereby improving productivity while minimizing an installation space.

Each post-processing unit of the post-processing apparatus 200 shown in FIG. 17 has the same structure as the post-processing apparatus 200 shown in FIG. 13. However, the embodiments of the present invention are not limited thereto. For example, each post-processing unit of the post-processing apparatus 200 shown in FIG. 17 has the same structure as the post-processing apparatus 200 shown in FIG. 12 or 16. Various other modifications are also possible.

Figure 18:
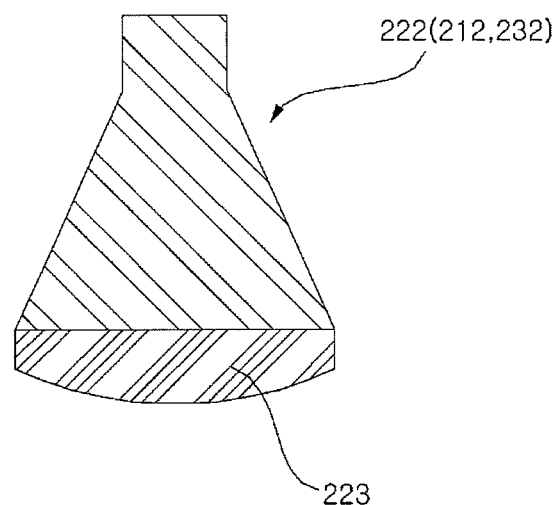
FIG. 18 is a view schematically showing the structure of a light source unit applicable to a post-processing apparatus of a solar cell according to a further modification of an embodiment of the present invention.

FIG. 18 is a view schematically showing the structure of a light source unit applicable to a post-processing apparatus of a solar cell according to a further modification of the embodiments of the present invention.

Referring to FIG. 18, in this embodiment of the present invention, the outer surface of a cover substrate 223 (i.e. the surface of the cover substrate 223 opposite to a solar cell 100 (see FIG. 12)) may be convex to the solar cell 100. As a result, light may be more uniformly supplied to the solar cell 100 through the cover substrate 223 such that the light can be more uniformly distributed over the solar cell 100. The outer surface of the cover substrate 223 may be variously convex. For example, the cover substrate 223 may include a base substrate 223a (see FIG. 12) which is convex outward and a plurality of layers 223b (see FIG. 12), positioned on the base substrate 223a, having different refractive indices. As a result, the cover substrate 223 may be convex outward. Various other modifications are also possible. On the other hand, a light source of a general plasma lighting system is used outside. For this reason, an outwardly concave cover substrate is generally used to improve straightness of light.

As is apparent from the above description, it is possible for the post-processing apparatus according to the embodiments of the present invention to stably and efficiently carry out the post-processing operation for supplying both heat and light so as to post-process the solar cell and to maintain temperature, light intensity, and process time necessary for the post-processing operation, thereby maximizing the effects of the main processing process.

The above described features, configurations, effects, and the like are included in at least one of the embodiments of the present invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as included in the scope and spirit of the invention as disclosed in the accompanying claims.

What is claimed is:

1. A post-processing apparatus of a solar cell that carries out a post-processing operation comprising a main period for heat-treating a solar cell comprising a semiconductor substrate while providing light to the solar cell, the post-processing apparatus comprising:
   a main section to carry out the main, period; and
   air curtains members, each of which is located at an edge of the main section to partition the main section from another section of the post-processing apparatus,
   wherein the main section comprises a first heat source to provide heat to the semiconductor substrate and a light source to provide light to the semiconductor substrate, the first heat source and the light source being positioned in the main section, and
   the light source and the first heat source respectively provide light and heat to the semiconductor substrate in a state in which the light source and the first heat source are spaced apart from each other.

2. The post-processing apparatus according to claim 1, wherein the light source comprises a plurality of light sources,
   the first heat source comprises a plurality of heat sources,
   the plurality of light sources are positioned adjacent to each other,
   the plurality of heat sources are positioned adjacent to each other, and
   the plurality of light sources and the plurality of heat sources are spaced apart from each other.

3. The post-processing apparatus according to claim 1, wherein,
   the light source is positioned at one side of the semiconductor substrate, and
   the first heat source is positioned at the other another side of the semiconductor substrate.

4. The post-processing apparatus according to claim 3, wherein the light source is positioned at an upper side of the semiconductor substrate, and
   the first heat source is positioned at a lower side of the semiconductor substrate.

* * * * *